United States Patent [19]
Goto et al.

[11] Patent Number: 5,518,955
[45] Date of Patent: May 21, 1996

[54] METHOD OF FABRICATING QUANTUM WIRE

[75] Inventors: Katsuhiko Goto; Yutaka Mihashi, both of Hyogo, Japan

[73] Assignee: Mitsubishi Denki Kabushiki Kaisha, Tokyo, Japan

[21] Appl. No.: 385,168

[22] Filed: Feb. 7, 1995

[30] Foreign Application Priority Data

Feb. 8, 1994 [JP] Japan .................. 6-013894

[51] Int. Cl.$^6$ .................................. H01L 21/20
[52] U.S. Cl. .................. 437/133; 437/105; 437/126; 437/129
[58] Field of Search .................... 437/126, 129, 437/132, 133, 105

[56] References Cited

U.S. PATENT DOCUMENTS

| | | | |
|---|---|---|---|
| 4,797,374 | 1/1989 | Scott et al. | 437/129 |
| 5,258,326 | 11/1993 | Morishima et al. | 437/105 |
| 5,296,719 | 3/1994 | Hirai et al. | 437/172 |

FOREIGN PATENT DOCUMENTS

| | | |
|---|---|---|
| 0535293 | 4/1993 | European Pat. Off. . |
| 2163928 | 6/1990 | Japan . |
| 316288 | 1/1991 | Japan . |
| 2180689 | 7/1986 | United Kingdom . |

OTHER PUBLICATIONS

Karam et al., "Patterning And Overgrowth Of Nanostructure Quantum Well Wire Arrays By LP–MOVPE", 5th International Conference on Metallogranic Vapor Phase Epitaxy, Jun. 1990, pp. 1–15.

Nishida et al., "Selective Area Growth Of InGaAs/InP By Chemical Beam Epitaxy And Its Growth Mechanism", 11th Alloy Semiconductor Physics And Electronics Symposium, 1992, pp. 347–354.

"A Quantum Wire Structure Laser Employing OMVRE", pp. 49–52.

Asada et al., "Gain and the Threshold of Three–Dimensional Quantum–Box Lasers", IEEE Journal of Quantum Electronics, vol. QE–22, No. 9, Sep. 1986, pp. 1915–1921.

Kapon et al., "Single Quantum Wire Semiconductor Lasers", Applied Physics Letters 55(26), Dec. 1989, pp.2715–2717.

Galeuchet et al., "Fabrication of Burried GaInAs/InP Quantum Wires by One–Step MOVPE Growth", Science and Engineering of One–and–Zero–Dimensional Semiconductors, 1990, Plenum Press, pp. 1–10.

*Primary Examiner*—R. Bruce Breneman
*Assistant Examiner*—Ramamohan Rao Paladugu
*Attorney, Agent, or Firm*—Leydig, Voit & Mayer

[57] ABSTRACT

A method of fabricating a quantum wire structure includes forming a first insulating film on a surface of a substrate of a first semiconductor, the insulating film including a pattern of spaced apart mask elements having a width not exceeding 100 nm; selectively growing a layer of a second semiconductor on the surface of the substrate employing the insulating film as a growth mask, the layer including spaced apart second semiconductor elements, each second semiconductor element having a trapezoidal cross-section transverse to the surface of the substrate and including an upper surface generally parallel to the surface of the substrate and sloped surfaces oriented so that a third semiconductor does not grow on the sloped surfaces; growing a layer of a third semiconductor having a smaller band gap energy than the band gap energies of the first and second semiconductors on the upper surfaces of the second semiconductor elements and on the surface of the substrate between adjacent second semiconductor elements but not on the sloped surfaces of the second semiconductor elements, the third semiconductor forming quantum wires; and growing a layer of a fourth semiconductor having a band gap energy larger than the band gap energy of the third semiconductor on and burying the layers of the second and third semiconductors.

4 Claims, 16 Drawing Sheets

Fig.2
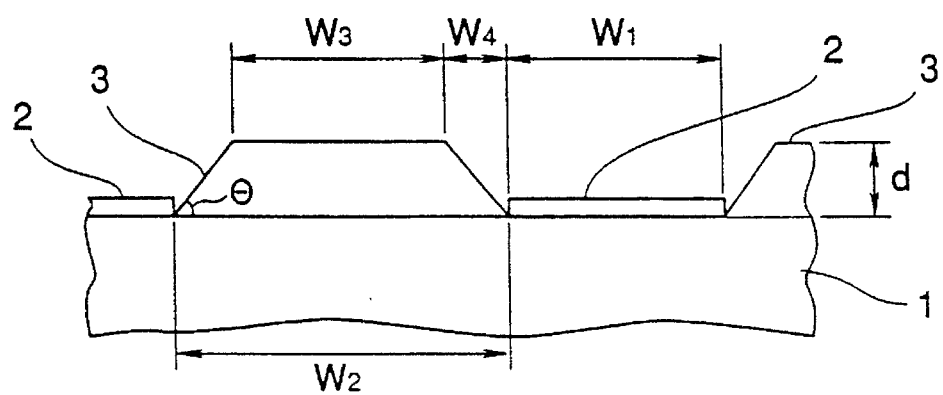
Fig.3
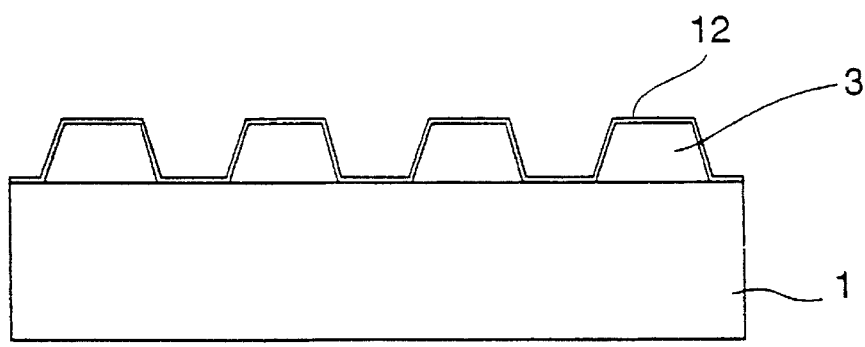
Fig.3(a)
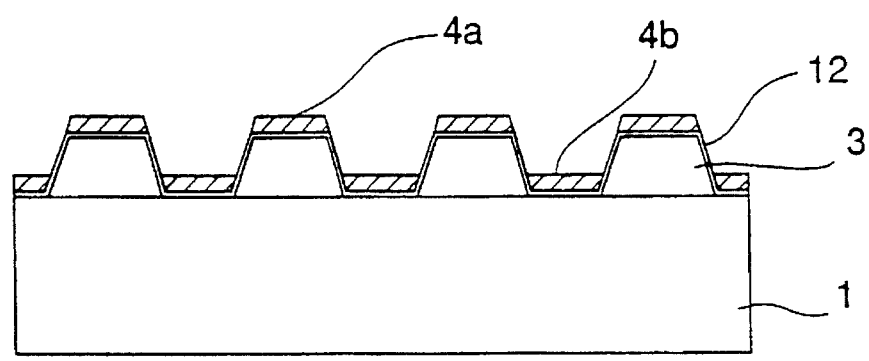
Fig.3(b)

Fig.6
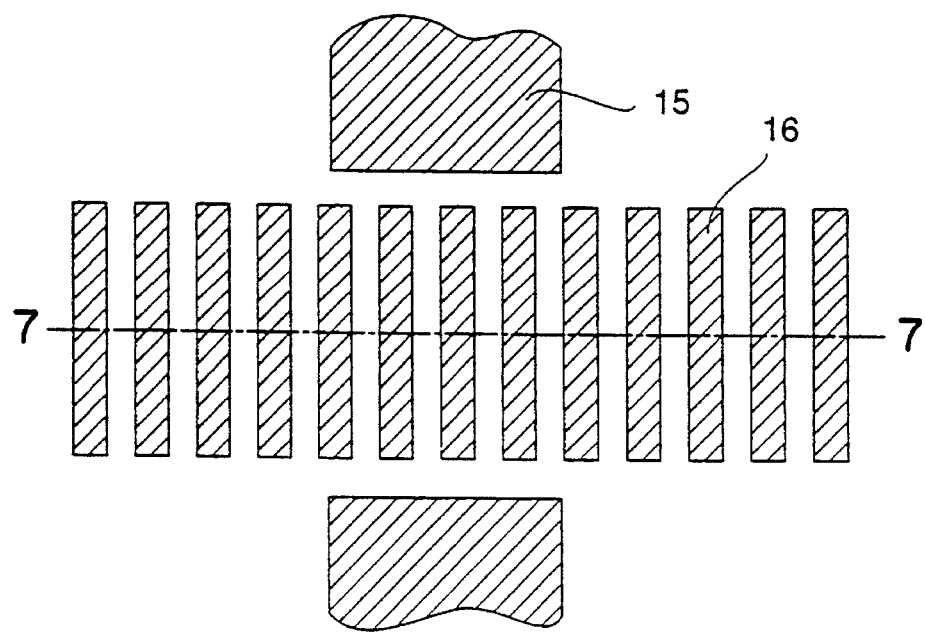
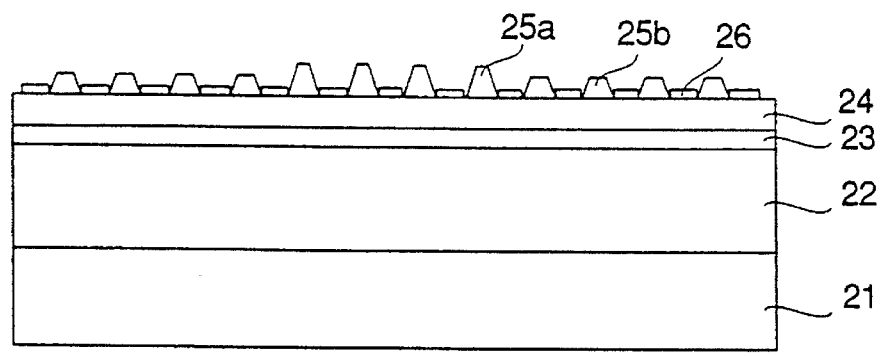
Fig.7(a)
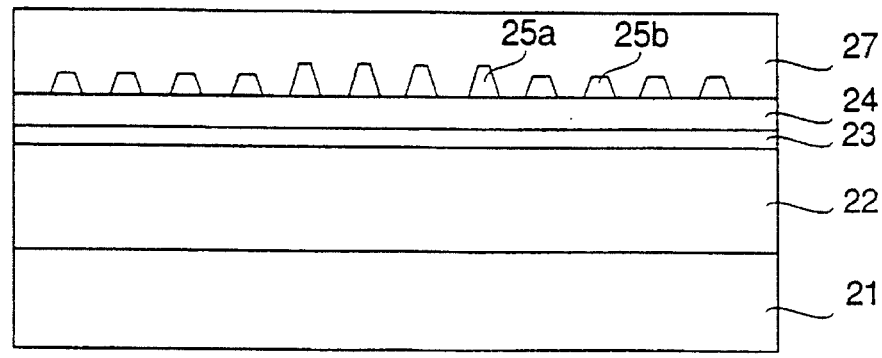
Fig.7(b)

METHOD OF FABRICATING QUANTUM WIRE

FIELD OF THE INVENTION

The present invention relates to a quantum wire structure such as a quantum wire or diffraction grating used in a semiconductor laser, and a fabricating method thereof. Further, the invention relates to a quantum wire laser, and a method of fabricating a quantum wire laser, a method of fabricating a diffraction grating, and a distributed feedback type semiconductor laser.

BACKGROUND OF THE INVENTION

FIGS. 12 to 16 are diagrams for explaining effects of a quantum wire and a quantum box recited in IEEE Journal of Quantum Electronics, Vol.QE-22, No.9, September 1986 p.1915–1921.

FIG. 12 is a perspective view illustrating an active layer in bulk. In the figure, reference numeral 91 designates a bulk layer comprising GaAs having a thickness of 20 nm or more. Reference numeral 92 designates cladding layers comprising $Al_{0.2}Ga_{0.8}As$ disposed so that the GaAs bulk layer 91 is between the cladding layers 92. FIG. 13 is a perspective view illustrating a quantum thin film active layer. In the figure, reference numeral 93 designates a quantum thin film comprising GaAs having a thickness of 10 nm. FIG. 14 is a perspective view illustrating a quantum wire. In the figure, reference numeral 94 designates a quantum wire comprising GaAs having a thickness of 10 nm and a width of 10 nm. FIG. 15 is a perspective view illustrating a quantum box. In the figure, reference numeral 95 designates a quantum box comprising GaAs having a thickness of 10 nm, a width of 10 nm, and a length of 10 nm. FIG. 16 is a graph representing quantum effects which are obtained when the bulk layer 91, the quantum thin film 93, the quantum wire 94, and the quantum box 95 are applied to a semiconductor laser. The abscissa represents injected carrier concentration and the ordinate represents the obtained maximum gain.

A description is given of an operation and a principle of these lasers. The active layer serving as a light emitting region of a semiconductor laser is surrounded by materials having a larger energy band gap than that of the active layer, whereby carriers injected into the active layer are efficiently confined in the active layer. In the description here, it is assumed that there is about 0.26 eV difference in the energy band gap between the active layer and the materials having a larger energy band gap than that of the active layer. FIG. 12 shows a bulk active layer 91 that has been widely employed and when the bulk active layer 91 is replaced by a quantum thin film 93 having a thickness of 20 nm or below as shown in FIG. 13, a large gain is obtained even when the injected carrier concentration in the active layer is the same. One which is obtained by applying such quantum effect also to the width direction is a quantum wire 94 shown in FIG. 14, and one which is obtained by applying the same further to the length direction is a quantum box 95 shown in FIG. 15. FIG. 16 is a diagram showing the calculated values of the maximum gains of the laser relative to the carrier concentrations in these respective active layer structures. As is found from the figure, at a carrier concentration of $3-4\times 10^{18} cm^{-3}$, the gain increases in the order of the bulk 91, the quantum thin film 93, the quantum wire 94, and the quantum box 95.

Because the oscillation threshold current of a laser decreases as the obtained gain increases, the threshold current decreases in order of the bulk 91, the quantum thin film 93, the quantum wire 94, and the quantum box 95 in the range of the above-described carrier concentration.

At present, while semiconductor lasers employing the bulk active layer 91 and the quantum thin film 93 have been put into practice, the quantum wire 94 and the quantum box 95 have not been put into practice in semiconductor lasers due to difficulty in their fabrication. However, studies for the quantum wire 94 are being actively advanced and a semiconductor laser employing the same has been fabricated experimentally.

FIG. 17 is a diagram illustrating a structure of a prior art quantum wire laser recited in, for example, an article by Professor Tada of Tokyo University, "A Quantum Wire Structure Laser Employing OMVPE" (hereinafter referred to as reference (1)). In the figure, reference numeral 201 designates an n type InP substrate. Reference numeral 202 designates an n type InP buffer layer, numeral 203 designates an n type GaInAsP waveguide layer, numeral 204 designates an n type InP barrier layer, numeral 205 designates an undoped GaInAsP quantum well layer, numeral 206 designates a p type InP layer, numeral 207 designates a p type InP cladding layer, numeral 208 designates a $p^+$ type GaInAsP cap layer, numeral 209 designates a $SiO_2$ film, numeral 210 designates a p side electrode comprising Au/Zn, and numeral 211 designates an n side electrode comprising Au/Sn.

FIGS. 18(a) to 18(c) are diagrams for explaining the fabrication process of the quantum wire laser shown in FIG. 17. In the figures, the same numerals are used to designate the same or corresponding portions in FIG. 17.

A fabrication process of a quantum wire laser shown in FIG. 17 will be described in accordance with FIGS. 18(a) to 18(c). First of all, an n type InP buffer layer 202 having a carrier concentration of $2\times 10^{18} cm^{-3}$ and a layer thickness of 2 μm, an n type GaInAsP waveguide layer 203 having a composition producing a light of 1.3 μm wavelength, a carrier concentration of $2\times 10^{18} cm^{-3}$, and a layer thickness of about 50 nm, an n type InP barrier layer 204 having a carrier concentration of $2\times 10^{18} cm^{-3}$ and a layer thickness of 20 nm, an undoped GaInAsP quantum well layer 205 having a composition producing light of 1.56 μm wavelength and a layer thickness of about 30 nm, and a p type InP layer 206 having a carrier concentration of $5\times 10^{17} cm^{-3}$ and a layer thickness of 20 nm are subsequently crystalline grown by OMVPE (organic metal vapor phase epitaxy) on an n type InP substrate 201 (FIG. 18(a)).

Such a single layer quantum well structure is subjected to multi-dimensionalization of an active layer that is carried out employing an interference exposure and wet etching. More particularly, employing a resist pattern having a period of about 220 nm in an <01$\bar{1}$> direction that is formed by interference exposure employing a He-Cd laser beam and a mask, wet etching employing $HBr:HNO_3:H_2O$ solution is carried out to form a grating configuration having a depth of about 60 nm (FIG. 18(b)).

After removing the resist, a regrowth of a p type InP cladding layer 207 having a carrier concentration of $5\times 10^{17} cm^{-3}$ and a layer thickness of 2 μm and a $p^+$ type GaInAsP cap layer 208 is carried out at a relatively low temperature of 600° C. or so by OMVPE (FIG. 18(c)), and further a process of electrode formation or the like is carried out to complete the quantum wire laser shown in FIG. 17.

FIG. 19 is a cross sectional structural view illustrating a structure of another prior art quantum wire laser disclosed in, for example, "single quantum wire semiconductor lasers" by E. Kapon, et al., Appl. Phys. Lett. 55(26), 25 Dec. (1989), pp2715–2717 (hereinafter referred to as reference (2)).

In the figure, reference numeral 101 designates an n type GaAs substrate having a (100) surface. Reference numeral 109 designates a V-shaped groove formed in the [01$\bar{1}$] direction on the surface of the substrate 101 having a bottom 109a and sloped surfaces 109b. An n type $Al_{0.5}Ga_{0.5}As$ lower cladding layer 121 having a thickness of 1.25 μm is disposed on the substrate 101. An n type $Al_xGa_{1-x}As$ lower graded cladding layer 122 0.2 μm thick is disposed on the lower cladding layer 121. Layer 122 has an Al composition x which is equal to 0.5 at the side in contact with the lower cladding layer 121 and gradually decreases toward the upper layer and is equal to 0.2 at the side in contact with the upper cladding layer. A quantum thin film active layer 123 comprising GaAs 7 nm thick is disposed on the lower graded cladding layer 122, and it has a region 123a on the V-shaped groove bottom 109a and regions 123b on the V-shaped sloped surfaces 109b. A p type $Al_xGa_{1-x}As$ upper graded cladding layer 124 0.2 μm thick is disposed on the active layer 123 and it has an Al composition which is equal to 0.2 at the side contacting the active layer 123 and gradually increases toward upper layer up to 0.5. A p type $Al_{0.5}Ga_{0.5}As$ upper cladding layer 125 1.25 μm thick is disposed on the upper graded cladding layer 124 and a p type GaAs cap layer 105 0.2 μm thick is disposed on the upper cladding layer 125. Reference numeral 106 designates a current blocking region formed by proton injection, reference numeral 107 designates a p side electrode and reference numeral 108 designates an n side electrode.

This prior art quantum wire semiconductor laser is fabricated as follows. First of all, a stripe V-shaped groove 109 extending in the [01$\bar{1}$] direction is formed on the (100) n type GaAs substrate 101 employing $H_2SO_4:H_2O_2$ (30 mole %):$H_2O$ (volume ratio 1:8:40) as an etching solution. The aperture width and depth of the groove are both approximately 5 μm.

Subsequently, in the substrate 101 on which the groove 109 is formed, MOCVD (Metal Organic Chemical Vapor Deposition) is carried out to successively laminate an AlGaAs lower cladding layer 121, an AlGaAs lower graded cladding layer 122, a GaAs quantum thin film active layer 123, an AlGaAs upper graded cladding layer 124, an AlGaAs cladding layer 125, and a GaAs cap layer 105. When such a series of crystal growths are carried out, respective AlGaAs layers would grow relatively thick on the sloped surface 109b of the V groove 109 leaving a configuration of the V groove 109 while the GaAs quantum thin film active layer 123 would grow relatively thick on the V groove bottom part 109a, thereby forming a crescent moon shaped region 123a 10 nm thick. On the other hand, the active layer 123b on the groove sloped surface 109b is thin, about 7 nm, and its energy band gap is larger than the crescent moon shaped active layer 123a due to the quantum effect. Accordingly, the crescent moon shaped active layer 123a forms a quantum wire structure which is between upper and lower graded cladding layers 122 and 124 which comprise materials having a larger energy band gap than that of the material constituting the active layer 123 in the up-and-down direction. The quantum wire structure is between active layers 123b having a larger energy band gap than that of the crescent moon shaped active layer 123a because of a difference in layer thickness in the transverse direction.

After the above-described crystal growth process, protons are implanted from the surface of the cap layer 105 into a region other than the region confronting the V groove bottom part 109a, thereby forming a current blocking region 106. Thereafter, a p side electrode 107 is formed on the cap layer 105 and an n side electrode 108 is formed on the rear surface of the substrate 101, thereby completing a semiconductor laser shown in FIG. 18.

As for the laser operation, when a current is injected with a negative electrode of a current supply connected to the n side electrode 108 and a positive electrode of a current source to the p side electrode 107, a current passes through the region on the bottom part 109a of the V groove where the current blocking region 106 is not present and is injected into the quantum wire 123a, thereby producing a laser oscillation.

FIGS. 20(a) to 20(c) illustrate processes of a prior art fabricating method of a quantum wire recited in "Patterning and overgrowth of nanostructure quantum well wire arrays by LP-MOVPE" by N. H. Karam, et al., Journal of Crystal Growth 107 (1991) 591–597, North-Holland (hereinafter referred to as reference (3)). In the figures, reference numeral 301 designates a GaAs wafer. Reference numeral 302 designates a first AlGaAs layer crystalline grown on the GaAs wafer 301. Reference numeral 303 designates a GaAs layer crystalline grown on the first AlGaAs layer 302. Reference numeral 304 designates a V groove. Reference numeral 305 designates a second AlGaAs layer crystalline grown by low pressure metal organic vapor phase epitaxy (LP-MOVPE).

In this prior art example, employing X-ray nanolithography patterning and overgrowth employing LP-MOVPE technique, a GaAs quantum well wire (QWW) array having a horizontal dimension in a range of 10 to 70 nm and a period of 200 nm, i.e., of nm scale is fabricated.

A description is given of this prior art fabricating method of a quantum wire recited in reference (3). First of all, as shown in FIG. 20(a), a GaAs film 303 5 to 20 nm thick is deposited on the GaAs substrate 301 on which the first AlGaAs layer 302 is present. The wafer is thereafter patterned by photolithography employing an X-ray nanolithography technique, it is etched with a $NH_4OH:H_2O_2:H_2O$ solution which etches GaAs and AlGaAs at the same etching rate, whereby a GaAs wire array 303a having a wire width of 60 to 80 nm and V grooves 304 reaching within the AlGaAs layer and having a period of 200 nm are formed as shown in FIG. 20(b). Subsequently, the wafer is cleaned and it is installed in an MOCVD reactor, and a second AlGaAs layer 305 then is crystalline grown so as to bury the V grooves 304 and GaAs wire array 303a, thereby completing a quantum wire structure shown in FIG. 20(c).

FIGS. 21(a) and 21(b) illustrate another prior art fabricating method of a quantum wire recited in reference (3). In the figures, reference numeral 401 designates a GaAs wafer, numeral 402 designates a V groove formed in the GaAs wafer 401. Reference numeral 403 designates a first AlGaAs layer, numeral 404 designates a GaAs quantum wire, and numeral 405 designates a second AlGaAs layer.

First of all, the GaAs wafer 401 is patterned by the same method as the patterning method employed in the fabricating method shown in FIG. 20, whereby a saw-tooth wave structure having a period of 200 nm is formed (FIG. 21(a)). Here, the depth of the V groove 402 is typically in a range of 40 to 60 nm, and this is determined by the groove width and the (111)A surface having a small etching rate. Subsequently, the wafer is cleaned and placed into a reaction furnace, and as shown in FIG. 21(b), the first AlGaAs layer 403, the GaAs quantum wire 404, and the second AlGaAs layer 405 are successively crystalline grown. Here, the GaAs layer is crystalline grown only in the V groove that is generated at the surface of the first AlGaAs layer 403 following the configuration of the V groove 402 formed in the substrate 401, whereby a quantum wire structure in which the GaAs layer 404 is surrounded by the first AlGaAs layer 403 and the second AlGaAs layer 405 is obtained. The size of the quantum wire fabricated is 15 nm/side (width of about 30 nm), and in this prior art a quantum wire structure integrating quantum wires at a period of approximately 200 nm is realized.

FIGS. 22(*a*) to 22(*d*) show process steps of a prior art fabricating method of a quantum wire recited in, "InGaAs/InP quantum wires selectively grown by chemical beam epitaxy", by Toshio Nishida, et al., Journal of Crystal Growth 132 (1993) 91–98, North-Holland (hereinafter referred to as reference (4)). In the figures, reference numeral 501 designates an n type InP substrate having a (001) surface. Reference numeral 502 designates a $SiO_2$ pattern formed on the surface of the substrate 501. Reference numeral 503 designates an InP buffer layer crystalline grown on the surface of the substrate 501 at an aperture portion of the $SiO_2$ pattern 502. Reference numeral 504 designates an InGaAs well layer crystalline grown on the InP buffer layer 503. Reference numeral 505 designates an InP cap layer crystalline grown so as to cover the InGaAs well layer 504.

The prior art fabricating method of a quantum wire recited in this article forms a fine pattern InGaAs quantum wire utilizing electron beam (EB) lithography and the fact that InGaAs is not grown on (111)B surface of n type InP by chemical beam epitaxy (CBE) growth.

A description is given of this prior art fabricating method of a quantum wire recited in the reference (4). First of all, as a mask material for the selective growth, an $SiO_2$ film deposited by RF magnetron sputtering is employed. After depositing the $SiO_2$ film on an n type InP substrate 501 containing Sn and having a (001) surface, EB exposure resist is spin coated on the $SiO_2$ film. The respective thicknesses of the $SiO_2$ film and the resist are respectively 50–100 nm and 170 nm. Next, a grating pattern along the [110] direction is exposed by EB exposure technique. The developed resist pattern is transferred onto the $SiO_2$ by RIE employing $C_2F_6$, the resist is removed, and the substrate is cleaned with concentrated sulfuric acid, whereby a substrate 501 having a $SiO_2$ pattern 502 formed on its surface is obtained as shown in FIG. 22(*a*).

Thereafter, as shown in FIGS. 22(*b*) to 22(*d*), on the substrate 501 an InP buffer layer 503, an InGaAs single quantum well layer 504 and an InP cap layer 505 are successively crystalline grown by CBE. The source materials are trimethylindium (TMI), triethylgalium (TEG), phosphine ($PH_3$), and arsine ($AsH_3$). The growth temperatures are 515° C. for InP and 520° C. for InGaAs at a pressure of $10^{-2}$Pa.

As shown in FIG. 22(*b*), a {111}B surface appears on both side surfaces of the InP buffer layer 503 that is grown along the [110] direction. Further, as shown in FIG. 22(*c*), the surface growth of InGaAs single quantum well layer 504 onto the {111} B surface is really slow relative to the growth onto the (001) surface. By this difference in growth speed, it is possible to realize an InGaAs quantum well layer that is effectively surrounded by both of an InP buffer layer and a cap layer as shown in FIG. 22(*d*), and the width of the InGaAs well can be made still smaller than the width of the opening. In the reference, an InGaAs well of 55 nm width is formed at the opening of 110 nm width.

FIGS. 23(*a*) to 23(*e*) show another prior art fabricating method of a quantum wire structure or a quantum box structure recited in, for example, Japanese Published Patent Application No. Hei. 2-163928. In the figures, reference numeral 601 designates a GaAs substrate, numeral 602 designates a $SiO_2$ film disposed on the substrate 601, numeral 603 designates an opening provided in the $SiO_2$ film 602. Reference numeral 604 designates a GaAs buffer layer, numeral 605 designates a first AlGaAs layer, numeral 606 designates a GaAs layer, and numeral 607 designates a second AlGaAs layer.

A description is given of the fabrication process of this prior art example. First of all, as shown in FIG. 23(*a*), a $SiO_2$ film 602 is formed covering the (100) surface of the GaAs substrate 601, and apertures 603 between the $SiO_2$ film 602' of width d1 are formed. When a quantum wire is to be formed, the apertures 603 have rectangular configurations between the stripe-shaped $SiO_2$ film 602' of width d1, while when a quantum box is to be formed, the apertures 603 have rectangular configurations having the same center, surrounding the $SiO_2$ film 602' of a square configuration having a length of d1 for one edge.

On the GaAs substrate 601 on which the above-described processing is performed, a GaAs buffer layer 604 is crystalline grown by MOVPE. In this crystal growth, there is an anisotropy in the growth speed, i.e., the growth is faster on the (100) surface and the growth hardly occur in the (111)B surface. Accordingly, when a crystal growth by MOVPE is carried out selectively on the (100) surface having a window as shown in FIG. 23(*a*), crystal growth is stopped when a projection having a triangle cross section surrounded by the (111)B surface is formed as shown in FIG. 23(*b*), thereby forming a hollow of a quasi V shaped cross section surrounded by the projections.

Next, the $SiO_2$ films 602 and 602' are removed and a first AlGaAs layer 605 is grown by atomic layer epitaxy (ALE). Since the ALE supplies materials for respective constitutional elements to grow atomic layers one by one and presents no anisotropy, the crystal growth proceeds on (111)B surface as well as on (100) surface, and as shown in FIG. 23(*c*), the first AlGaAs layer 605 is grown on the entire surface of the wafer. The (100) surface at the bottom of the quasi V shaped hollow having initially a width of d1 reduces its width with the growth of the first AlGaAs layer 605, and as shown in the figure, the first AlGaAs layer 605 is grown until the width becomes d2. This width d2 becomes the width of a quantum wire or a quantum box.

Subsequently, a GaAs layer is formed by deposition to a thickness of several atomic layers by MOVPE. This thickness is set to a value that is appropriate for confinement of carriers and is controlled by the speed and time of supplying materials. Because the crystal growth by MOVPE is anisotropic and the growth speed of the first AlGaAs layer 605 formed by ALE on the (111) B surface is almost 0, the crystal growth only proceeds on the (100) surface, and as shown in FIG. 23(*d*), a GaAs layer 606 of a width d2 is formed at the bottom of the quasi V shaped hollow.

Thereafter, a second AlGaAs layer 607 is grown again by ALE. Because this second AlGaAs layer 607 is grown isotropically, it envelops the GaAs layer 606 as shown in FIG. 23(*e*), thereby obtaining a structure as a quantum wire or a quantum box.

FIGS. 24(*a*) to 24(*d*) are diagrams for illustrating a prior art fabricating method of a semiconductor laser element having a diffraction grating (DFB laser) recited in, for example, Japanese Published Patent Application No. Hei. 3-16288. In the figures, reference numeral 701 designates an n type GaAs substrate having a (001) surface. Reference numeral 702 designates an n type GaAs buffer layer. Reference numeral 703 designates an n type AlGaInP cladding layer. Reference numeral 704 designates an undoped AlGaInP active layer. Reference numeral 705 designates a first p type AlGaInP cladding layer. Reference numeral 706 designates a p type GaInP diffraction grating formation layer. Reference numeral 707 designates a second p type AlGaInP cladding layer. Reference numeral 708 designates a p type GaInP layer. Reference numeral 709 designates a p type GaAs contact layer. Reference numeral 711 designates a p side electrode and numeral 712 designates an n side electrode. Reference numeral 713 designates a SiO$_2$ film and numeral 714 designates a resist.

A description is given of a fabrication process of this semiconductor laser. First of all, on an n type GaAs substrate 701 having a (001) surface, an n type GaAs buffer layer 702 having a thickness of 0.5 μm and an impurity concentration of $1\times10^{18}$cm$^{-3}$ an n type $(Al_xGa_{1-x})_{0.51}In_{0.49}P$ cladding layer 703 having a thickness of 0.8 to 1.0 μm and an impurity concentration of $1\times10^{17}$cm$^{-3}$, and Al composition x of 0.6, an undoped $(Al_yGa_{1-y})_{0.51}In_{0.49}P$ active layer 704 having a thickness of 0.04 to 0.08 μm and Al composition of y ($0 \leq y < 0.1$), and a first p type $(Al_xGa_{1-x})_{0.51}In_{0.49}P$ cladding layer 705 having a thickness of 0.2 to 0.8 μm, an impurity concentration of $7\times10^{17}$cm$^{-3}$, and Al composition x=0.6 are successively epitaxially grown by MOCVD. Next, a SiO$_2$ film 713 of 0.1 to 0.2 μm thickness is evaporated on the p type cladding layer 705, and after depositing photoresist 714 thereon, a patterning of the resist 714 at a period of Λ=280–290 nm is carried out by the interference exposure method employing a He-Cd laser of wavelength 325 nm (FIG. 24(a)).

Thereafter, employing the resist 714 as a mask, the SiO$_2$ film 713 is etched with a hydrofluoric acid solution, thereby obtaining a diffraction grating pattern comprising the SiO$_2$ film 713 as shown in FIG. 24(b).

Next, a p type Ga$_{0.51}$In$_{0.49}$P diffraction grating formation layer 706 having a thickness of 60 to 120 nm, an impurity concentration of $1\times10^{18}$ to $1\times10^{19}$cm$^{-3}$ is selectively grown by MOCVD method, thereby forming a periodic diffraction grating in a trapezoidal configuration as shown in FIG. 24(c). Thereafter, the SiO$_2$ film 713 is etched and removed, and the second p type $(Al_xGa_{1-x})_{0.51}In_{0.49}P$ cladding layer 707 having a thickness of 0.5 to 0.8 μm, an impurity concentration of $7\times10^{17}$cm$^{-3}$, and Al composition x=0.6, a p type Ga$_{0.51}$In$_{0.49}$P layer 708 having a thickness of 0.05 to 0.1 μm and an impurity concentration of $1\sim3\times10^{18}$cm$^{-3}$ and a p type GaAs contact layer 709 having a thickness of 1.0 to 2.0 μm and an impurity concentration of $5\times10^{18}$ to $5\times10^{19}$cm$^{-3}$ are grown by MOCVD. Thereafter, other required processes including forming a p side electrode 711 on the contact layer 709 and an n side electrode 712 on the rear surface of the substrate 701, are carried out to complete the DFB laser shown in FIG. 24(d).

According to this prior art example, the configuration of the diffraction grating can be determined only by the crystal growth conditions without employing etching, whereby a semiconductor laser element having a diffraction grating can be fabricated with high reproducibility. In addition, in this prior art example, it is recited that a semiconductor laser element which can realize a dynamic vertical single mode at a high speed modulation of 10 GHz or above can be fabricated by forming a λ/4 shifted diffraction grating pattern shifting the phase at the element central portion by λ/4 during the patterning of the SiO$_2$ film.

The prior art fabricating method of a quantum wire recited in the reference (1) uses a single layer quantum well structure that is epitaxially grown so as to make the same in a fine wire configuration employing etching. Thereby, it has a problem that the fine wires are damaged by the etching. Particularly, there was a problem that the damage is noticeable when formation of wires is carried out by dry etching that is superior in the controllability in the width direction to the wet etching. In addition, since after a single layer quantum well structure is crystalline grown, it is taken out from the furnace, and fine wire processing by etching is executed to the wafer, and regrowth is again carried out in the growth furnace, there was a problem in that the fine wires could be changed by the reheating during the regrowth.

In addition, in the prior art fabricating method of a quantum wire recited in the reference (2), although it has no problem that the fine wires should be damaged by etching and the fine wires should be transformed by reheating as in the reference (1), because the size of the groove is as large as 3 to 5 μm, it was impossible to fabricate fine wires with high density two dimensionally.

In addition, in the prior art fabricating method of a quantum wire shown in FIG. 20 recited in the reference (3), because a semiconductor layer to be a quantum wire is formed by crystal growth in a plane configuration, it is then processed into a fine wire configuration by etching and, thereafter the semiconductor layer of the fine wire configuration is buried by regrowth, there is a problem that the fine wires should be damaged by etching similarly as in the prior art fabricating method of a quantum wire recited in the reference (1). Further, there was a problem that the fine wires could be transformed by reheating during the regrowth.

In addition, in the prior art fabricating method of a quantum wire shown in FIG. 21 recited in the reference (3), V grooves are formed on a substrate with minute intervals employing an X-ray nanolithography technique, thereby forming an array of quantum wires. However, the size and interval of the quantum well wires are 15 nm/side and a period of 200 nm, which are not so fine.

In addition, in the prior art fabricating method of a quantum wire recited in the reference (4), a quantum wire finer than the aperture width of a mask pattern is formed utilizing the surface direction dependency of crystal growth. Then, the interval between quantum wires is limited by limitations in the fine patterning of a mask pattern, which interval is about 20 to 30 nm at present.

In the prior art fabricating method of a quantum wire recited in Japanese Published Patent Application No. Hei. 2-163928, a fine quantum wire finer than the mask pattern width is formed employing the ALE technique and the surface direction dependency of crystal growth. Because the quantum wires are formed between semiconductor layers which are crystalline grown in a triangular configuration cross section, it was difficult to obtain an array structure comprising quantum wires arranged at fine intervals.

In utilizing quantum wires for a semiconductor laser, in order to obtain an effect of enhancing the laser characteristics owing to a quantum wire, it is necessary to form wires having no processing damages and to form wires with high density by narrowing the intervals between wires. Because of the problems described above, however, there is actually no example which could confirm the enhancement of laser characteristics.

On the other hand, a diffraction grating of a DFB (distributed feedback) laser is usually formed by the same method as disclosed in the reference (1), i.e., by etching of a semiconductor layer to be a diffraction grating employing a resist pattern formed by interference exposure as a mask.

Accordingly, the configuration of a diffraction grating is transformed due to the reheating while performing the regrowth as described with regard to the problems in the fabricating method of a quantum wire, whereby the DFB laser cannot be fabricated with high reproducibility. In addition, in order to produce a so called λ/4 shifted diffraction grating by this method, a method of performing two photolithography steps employing interference exposure and a method of subsequently depicting respective patterns by EB direct drawing have to be used to form a resist pattern, whereby a long time is required for the fabrication, resulting in a lowered throughput. Although in the DFB laser it is already proposed to change the height of a diffraction grating partially so as to adjust the light density distribution in the resonator length direction and suppress hole burning, this formation method of a diffraction grating can only form a diffraction grating of uniform height, and in order to change the height of a diffraction grating partially, a method such as etching partially in a separate process has to be employed.

In the prior art fabricating method of a DFB laser recited in Japanese Published Patent Application No. Hei. 3- 16288, it is possible to determine the configuration of a diffraction grating only by the crystal growth conditions without depending on the etching processing, and a semiconductor laser element having a diffraction grating can be fabricated with high reproducibility. However, as for the formation of a λ/4 shifted diffraction grating and adjustment of light density distribution in the resonator length direction, it involves the same problem as in the fabricating method of a diffraction grating employing the method recited in the reference (1).

SUMMARY OF THE INVENTION

It is an object of the present invention to provide a method of fabricating a quantum wire that can fabricate quantum wires which are integrated at high density with narrowed intervals between wires not subjected to processing damages.

Another object of the present invention is to provide a quantum wire that is fabricated by this fabricating method.

It is still another object of the present invention to provide a quantum wire laser including quantum wires that are integrated at high density without being subjected to processing damage and having improved laser characteristics and, a fabricating method for fabricating this quantum wire laser.

Another object of the present invention is to provide a method of fabricating a diffraction grating similar to the above-described method of fabricating a quantum wire.

Another object of the present invention is to provide a distributed feedback semiconductor laser having a diffraction grating that is fabricated by the above-described method of fabricating a diffraction grating.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

A method of fabricating a quantum wire according to a first aspect of the present invention includes forming an insulating film on a surface of a first semiconductor substrate in a fine pattern of a width 100 nm or below, selectively crystalline growing a second semiconductor layer having a cross section of a trapezoidal configuration which has semiconductor crystal surfaces on which no crystal growth of a third semiconductor occurs as its sloped surfaces on the surface of the first semiconductor substrate employing the insulating film as a mask, forming a third semiconductor layer having a smaller energy band gap than those of the first and the second semiconductor layers as a quantum wire on the upper surface having the trapezoidal configuration, which is a portion other than the sloped surfaces, comprising the semiconductor crystal surface of the selective growth layer of the second semiconductor and on the surface of the first semiconductor substrate between adjacent selective growth layers and, thereafter forming a fourth semiconductor layer having a larger energy band gap than that of the third semiconductor on the third semiconductor layer and on the second semiconductor layer so as to bury these layers. Therefore, quantum wires can be fabricated with high density and wires of a high quality having no processing damages are obtained.

A method of fabricating a quantum wire according to a second aspect of the present invention includes the first semiconductor substrate comprising InP, the second semiconductor comprising InP, and the third semiconductor is InGaAs, and the fourth semiconductor comprising InP. Therefore, the growth of the third semiconductor layer can be performed with a high selectivity ratio.

A method of fabricating a quantum wire according to a third aspect of the present invention includes the semiconductor crystal surfaces as the sloped surface of the second semiconductor selective growth layer comprising a (111)A surface or (111)B surface. Therefore, the growth of the third semiconductor layer can be performed with a high selectivity ratio.

A quantum wire according to a fourth aspect of the present invention includes a second semiconductor layer which is selectively crystalline grown on an insulating film which is formed on the surface of the first semiconductor substrate in fine patterns having a width of 100 nm or below, employing the insulating film as a mask, and which has a cross-section of a trapezoidal configuration and semiconductor crystal surfaces on which growth of a third semiconductor should not occur as sloped surfaces, a third semiconductor layer having a smaller energy band gap than those of the first and the second semiconductor and serving as a quantum wire, grown on the upper surface of the trapezoidal configuration as a portion other than the sloped surfaces of the semiconductor crystal surface of the selective growth on the second semiconductor layer and on the surface of the first semiconductor substrate between adjacent selective growth layers, and a fourth semiconductor layer having a larger energy band gap than that of the third semiconductor, formed on the third semiconductor layer and on the second semiconductor layer so as to bury these layers. Therefore, quantum wires of a high quality not subjected to processing damage and of high density can be fabricated.

A method of fabricating a quantum wire laser according to a fifth aspect of the present invention includes forming an insulating film on a surface of a first semiconductor substrate in a fine pattern having a width of 100 nm or below, crystalline growing selectively a second semiconductor layer which has a cross-section of a trapezoidal configuration and semiconductor crystal surfaces on which growth of a third semiconductor should not occur as sloped surfaces on the surface of the first semiconductor substrate, employing the insulating film as a mask, forming a third semiconductor layer having a smaller energy band gap than those of the first semiconductor and the second semiconductor on the upper surface of the trapezoidal configuration as a portion other than the sloped surfaces of the semiconductor crystal surface of the second semiconductor selective growth layer and on the surface of the first semiconductor substrate between the adjacent selective growth layers, thereby forming a third semiconductor layer serving as a quantum wire, forming a fourth semiconductor layer having a larger energy band gap than that of the third semiconductor on the third semiconductor layer and on the second semiconductor layer so as to bury these layers, forming a current confining structure for limiting a region through which a current flows to the active layer comprising the quantum wire, and forming electrodes for injecting a current into the active layer for the semiconductor layer structure that is obtained as described above. Therefore, because wires of high density and high quality not subjected to processing damage are obtained, a quantum wire laser having a low threshold current, high efficiency, and low temperature dependency as improved laser characteristics can be fabricated employing the wire as an active layer.

A fabricating method of a diffraction grating according to a sixth aspect of the present invention includes forming on a first semiconductor substrate a selective growth mask comprising a first mask of line-and-space having a pitch of 100 to 400 nm and a pair of second masks between a portion of the first mask in a direction perpendicular to the arranging direction of the first mask, performing a selective growth of a second semiconductor layer having a larger refractive index than that of the first semiconductor employing the selective growth mask so that the height of the selective growth layer becomes higher at a region between the second mask than at the other region, removing the mask, forming a third semiconductor layer having a smaller refractive index than that of the selective growth layer on the first semiconductor layer, so as to bury these layers. Therefore, a diffraction grating having different heights of respective diffraction grating portions dependent on regions can be obtained.

A distributed feedback semiconductor laser according to a seventh aspect of the present invention includes a diffraction grating having different heights dependent upon the regions in the resonator fabricated by the fabricating method of a diffraction grating that is described above, and the light density distribution in the resonator is adjusted because the height of the diffraction grating is different dependent upon the regions. Therefore, a required distribution can be obtained as a light density distribution in the resonator of distributed feedback laser.

The distributed feedback semiconductor laser according to an eighth aspect of the present invention has a diffraction grating which is high at the resonator central region and low at a resonator facet region. Therefore, the light density distribution in the laser resonator is made uniform.

The distributed feedback semiconductor laser according to a ninth aspect of the present invention includes a diffraction grating which has a region having a height different from other regions at the resonator central portion, and it functions as a one-fourth wavelength shift diffraction grating due to its change in refractive index. Therefore, a λ/4 shifted distributed feedback semiconductor laser can be easily obtained.

BRIEF DESCRIPTION OF DRAWINGS

FIG. 2 is a diagram for explaining dimensions of the quantum wire fabricated by the fabricating method of a quantum wire according to the first embodiment.

FIGS. 3(a) and 3(b) are cross sectional schematic diagrams illustrating a fabricating method of a quantum wire according to an alternative of the first embodiment.

FIG. 6 is a plan view illustrating a selective growth mask employed in a fabricating method of a diffraction grating according to a fourth embodiment of the present invention.

FIGS. 7(a) and 7(b) are cross sectional schematic diagrams illustrating a diffraction grating fabricated by a fabricating method of a diffraction grating according to a fourth embodiment of the present invention.

DETAILED DESCRIPTION OF PREFERRED EMBODIMENTS

Embodiment 1

Figure 1A:
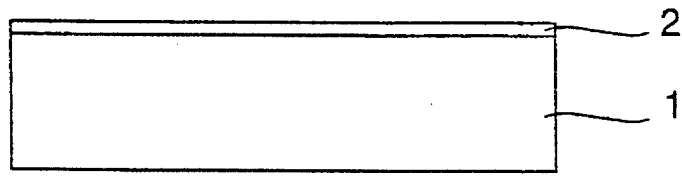
FIGS. 1(a) to 1(f) are cross sectional schematic diagrams illustrating a fabricating method of a quantum wire according to a first embodiment of the present invention.

A description is given of a method of fabricating a quantum wire for fabricating a quantum wire by selective growth, according to a first embodiment of the present invention. FIGS. 1(a) to 1(f) are cross sectional schematic diagrams illustrating the fabricating method.

In FIGS. 1(a) to 1(f), reference numeral 1 designates an n type InP substrate. Reference numeral 2 designates an insulating film formed on the n type InP substrate 1. Numeral 3 designates an n type InP layer selectively grown on an n type InP substrate 1 between insulating films 2 that are patterned in a stripe shape. Reference numerals 4a and 4b designate InGaAs layers respectively grown on the n type InP layer 3 and on the n type InP substrate 1 where the insulating film 2 is removed between the n type InP layers 3. Reference numeral 5 designates a p type InP layer that is grown on the InGaAs layers 4a and 4b and the n type InP layer 3.

A description is given of the fabricating method of a quantum wire of this first embodiment with reference to FIGS. 1(a)–1(f).

First of all, as shown in FIG. 1(a), on an n type InP substrate having (100) surface and having a thickness of 350 μm and an impurity concentration of about $4 \times 10^{18} \text{cm}^{-3}$, a $SiO_2$ film is formed by CVD, or an insulating film 2 such as natural oxidation film is formed at the surface of the n type InP substrate 1 in a thickness of several tens of nm. Here, this insulating film may comprise SiN or other material.

Figure 1B:
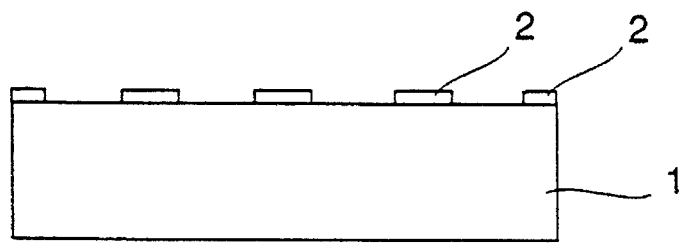

Next, as shown in FIG. 1(b), the insulating film 2 is patterned in a stripe shape having a width of about 20 nm in the [011] direction and having an interval of about 30 nm, that is, wider than the width of the insulating film 2, by an etching such as EB (electron beam) or FIB (focused ion beam).

Figure 1C:
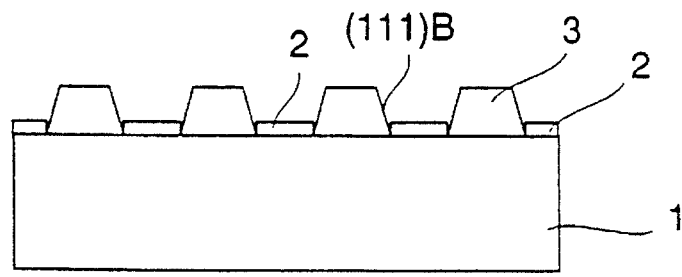

Next, as shown in FIG. 1(c), by a method such as MOCVD (metal organic chemical vapor deposition) or CBE (chemical beam epitaxy), n type InP is selectively grown to a height of about 7 nm on the n type InP substrate 1 exposed at the apertures where the insulating film 2 is removed employing the remaining insulating film 2 as a mask. Then, because the pattern of the insulating film 2 has a stripe directed in the [011] direction, the n type InP layer 3 has a trapezoidal cross-section and has (111)B side surfaces.

Figure 1D:
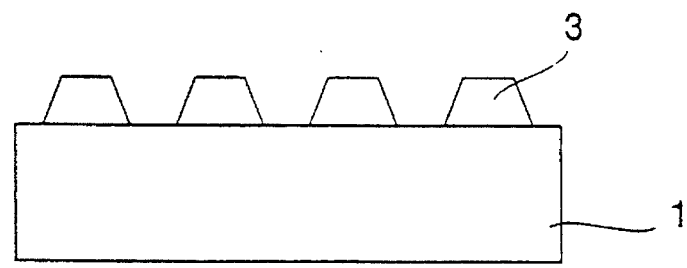

Next, as shown in FIG. 1(d), the insulating film 2 is entirely removed.

Figure 1E:
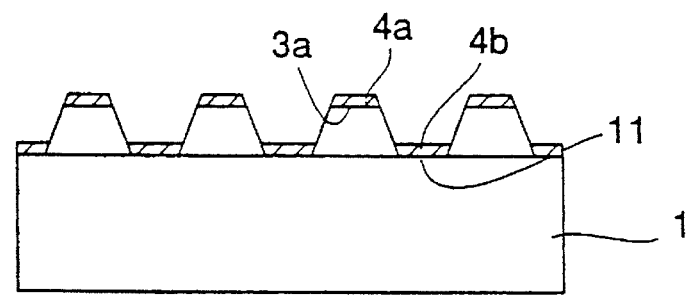

After entirely removing the insulating film 2, in a state having a plurality of n type InP layers 3 of trapezoidal configuration on the n type InP substrate 1, an InGaAs layer is grown to a thickness of about 5 nm on the entire surface thereof. InGaAs will not be grown on the (111)B surfaces of the n type InP layer 3, but it will be grown only on the upper surfaces 3a of the n type InP layer 3 of the trapezoidal configuration and on a portion 1a of substrate between the n type InP layer 3 of trapezoidal configuration as shown in FIG. 1(e), respectively forming InGaAs layers 4a and 4b. Here, that InGaAs would not be grown on the (111)B surfaces of the n type InP layer as is described in the reference (4).

FIG. 2 shows relations between the pattern width w1 and the pattern interval w2 of the insulating films 2, the layer thickness d of the n type InP layer 3, the width w3 of the flattened portion on the n type InP layer 3, and the interval w4 between wires. As is apparent from the figure, the width w3 of the flattened portion on the n type InP layer 3 is represented by $$w3 = w2 - 2w4 = w2 - 2 \ (\cot\theta \cdot d).$$

Since the side surfaces of the n type InP layer 3 are (111)B surfaces, the angle θ between the side surface of the n type InP layer 3 and the surface of the substrate 1 is about 55°. In addition, because the pattern interval w2 is 30 nm and the layer thickness d of the n type InP layer 3 is 7 nm, the width w3 of the flattened part on the n type InP layer 3 becomes $$30 - 2 \times 4.9 = 20.2 \ (nm),$$

and is approximately equal to the pattern width w1. The interval between wires w4 is 4.9 nm.

In more detail, both the InGaAs layer 4a formed on the flattened part 3a on the n type InP layer 3 and the InGaAs layer 4b formed on the substrate surface 11 between the n type InP layers 3 are wires of about 20 nm width and about 5 nm thickness and also the interval between the wires is quite narrow, 4.9 nm.

Figure 1F:
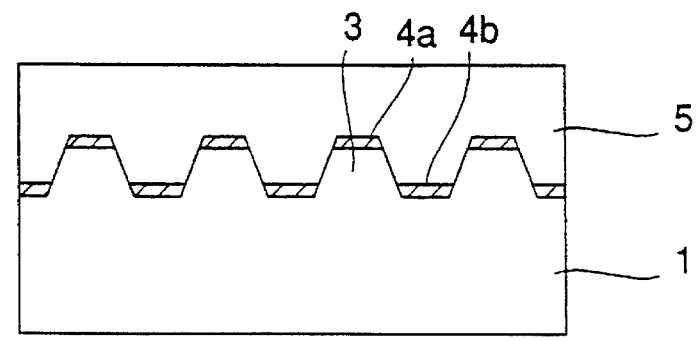

Subsequently, as shown in FIG. 1(f), a p type InP layer 5 having an impurity concentration of about $1 \times 10^{18} \text{cm}^{-3}$ is grown on the entire surface. By growing the InP layer 5 thick, InP is also grown on the (111)B surface, and the entire structure is buried by p type InP layer 5. As a result, a quantum wire structure comprising InGaAs wires 4a and 4b at high density along the pn junction formed between the n type InP substrate 1 and the p type InP layer 5 is obtained.

In the fabricating method of a quantum wire according to this first embodiment, n type InP layers 3 each having a trapezoid cross section and disposed at minute intervals are formed on the n type InP substrate 1, and, utilizing the fact that InGaAs is not crystalline grown on the (111)B surfaces, InGaAs layers 4a and 4b are crystalline grown respectively, on the flattened surface 3a on the n type InP layer 3 and on the substrate surface 11 between the n type InP layers 3, whereby fine dimension wires can be fabricated and arranged at quite fine intervals. As a result, wires of high density are realized that is about twice the density limitation of the conventional method. In the formation of wires described above, wires are all formed only by selective crystal growth, whereby wires subjected to no processing damages can be obtained. As a result, a quantum wire of high quality and superior in the optical characteristics is obtained.

In the above description, the pattern of the insulating film 2 has stripes in the [011] direction, and the n type InP layer 3 having a trapezoidal configuration cross section and (111)B side surfaces is grown. However, for example, an article "CODE: a novel single step MOVPE technique for the fabrication of low-dimensional devices, quantum wires and quantum dots", by A. J. Moseley, et al., Journal of Crystal Growth 108 (1991) 203–218, North-Holland, reports that InGaAs hardly grows on both of the (111)B surface and (111)A surface. Accordingly, the stripe pattern of the insulating film 2 can be made the [0$\bar{1}$1] direction and the n type InP layer 3 can be made having side surfaces comprising (111)A surfaces.

In the fabrication process shown in FIG. 1(a), n type InP layer 3 is crystalline grown and after removing the insulating film 2, InGaAs layers 4a and 4b are directly grown on the flattened surface 3a of the n type InP layer 3 and on the substrate surface 11. However, it may be that after an n type InP layer 12 is grown on the entire surface of the wafer as shown in FIG. 3(a), InGaAs layers 4a and 4b are grown as shown in FIG. 3(b). In this case, because the regrowth surface and the pn junction surface do not coincide with each other, a quantum wire structure having a high reliability is obtained.

While in the above-described embodiment InP and InGaAs are employed, other compound semiconductors may be employed. For example, a GaAs substrate that has an AlGaAs layer grown thicker than 0.5 μm on its surface may be employed in place of an n type InP substrate, an n type AlGaAs layer may be employed in place of the n type InP layer 3, a GaAs layer may be employed in place of the InGaAs layers 4a and 4b, and a p type AlGaAs layer may be employed in place of the p type InP layer 5. Then, an n type AlGaAs layer may be grown after growing a GaAs buffer layer on a GaAs substrate.

Embodiment 2

Figure 4:
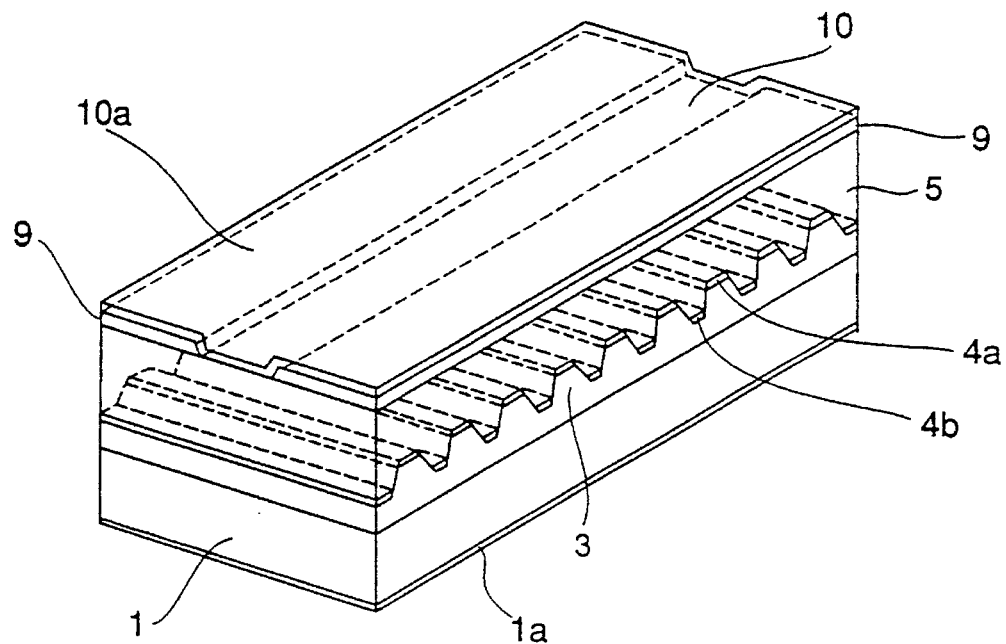
FIG. 4 is a perspective view illustrating a quantum wire laser according to a second embodiment of the present invention, which is fabricated by the fabricating method of a quantum wire according to the first embodiment.

FIG. 4 shows a quantum wire laser that employs the quantum wire structure of the first embodiment, according to a second embodiment of the present invention.

In the figure, reference numerals 1, 3, 5, 4a, and 4b designate the same elements as those shown in FIG. 1(f). Reference numeral 1a designates an n side electrode, numeral 9 designates a $SiO_2$ film for current confinement, numeral 10 designates a current injecting region, and numeral 10a designates a p side electrode.

As shown in FIG. 4, a structure illustrated in FIG. 1(f) having quantum wires 4a and 4b comprising InGaAs which are buried by the n type InP layer 3 and the p type InP layer 5 on the n type InP substrate 1 is formed by the method described in the first embodiment, and a $SiO_2$ film 9 is formed on the p type InP layer 5, and a stripe shaped aperture is provided to form a stripe shaped current injecting region 10 or a waveguide region in a direction perpendicular to the direction of the wires 4a and 4b, and electrodes 1a and 10a are formed at the side of substrate 1 and the side of the current injecting region, respectively.

In this second embodiment, a semiconductor laser employing a quantum wire that is fabricated according to the first embodiment is obtained. Therefore, because wires of high density having narrow wire intervals and of high quality and superior in the optical characteristics, not subjected to damages, are obtained, a semiconductor laser having low threshold current, high efficiency, and low temperature dependency as improved laser characteristics is obtained.

Embodiment 3

While the second embodiment of the present invention illustrated in FIG. 4 is that of the simplest electrode stripe structure, the structure of a laser may be of a desired structure. In the third embodiment of the present invention, a mesa is formed by etching in a stripe shape and it is further buried to form a laser having a buried heterostructure. The structure and fabricating method of this third embodiment will be described with reference to FIG. 5.

Figure 5:
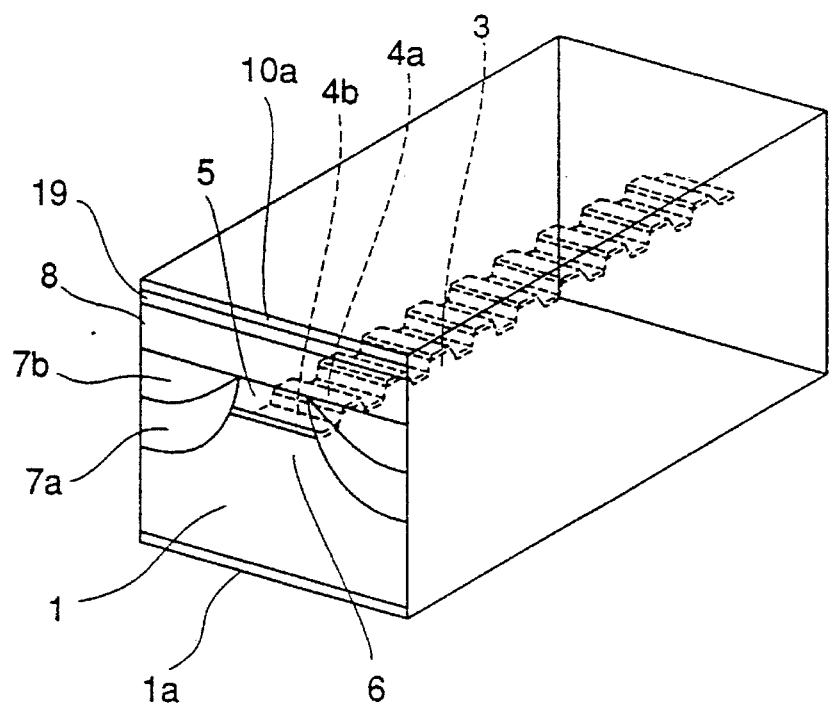
FIG. 5 is a perspective view illustrating a quantum wire laser according to a third embodiment of the present invention, which is fabricated by a fabricating method of a quantum wire according to the first embodiment.

In FIG. 5, illustrating a quantum wire laser of this third embodiment, reference numerals 1, 3, 4a, 4b, and 5 designate the same elements as those in the first embodiment. Reference numeral 1 designates an n type InP substrate. Numerals 4a and 4b designate quantum wires formed at alternatively higher positions and lower positions on the substrate 1. Reference numeral 5 designates a p type InP layer formed on the quantum wires 4a and 4b. Reference numeral 6 designates a ridge formed by ridge etching the n type InP substrate 1, the quantum wires 4a and 4b, and the p type InP layer (first upper cladding layer) 5. Reference numerals 7a and 7b designate current blocking layers each comprising a p type InP layer of impurity concentration of $1\times 10^{18} cm^{-3}$ and an n type InP layer of an impurity concentration of $5\times 10^{18} cm^{-3}$, respectively, formed by crystal growth at the concave parts at the sides of the ridge. Reference numeral 8 designates a p type InP second upper cladding layer of an impurity concentration of $1\times 10^{18} cm^{-3}$ formed on the p type InP layer 5 and on the current blocking layers 7b. Reference numeral 19 designates a p type InGaAsP contact layer formed on the p type InP layer 8. Reference numeral 10a designates a p side electrode formed on the p type InGaAsP contact layer 19 and numeral 1a designates an n side electrode formed at the side of the n type substrate 1.

A description is given of a fabricating method of a quantum well laser of this third embodiment.

By the method described in the first embodiment, quantum wires 4a and 4b are formed on the n type InP substrate 1 and a p type InP layer 5 is grown thereon to form a structure shown in FIG. 1(f).

Next, a ridge etching mask comprising $SiO_2$ or $Si_3N_4$ is patterned (not shown) on this structure and employing it as a mask, the structure of FIG. 1(f) is etched to form a ridge 6 comprising an upper portion of the n type InP substrate 1, quantum wires 4a and 4b, and the p type InP layer 5.

Thereafter, after the etching mask (not shown) is removed, crystal growth is again performed to successively form current blocking layers 7a and 7b comprising p type InP and n type InP, respectively, at the sides of the ridge 6.

Thereafter, a third crystal growth is performed on the upper surface of the p type InP layer 5 exposed as the upper surface of the ridge 6 and as the upper surface of the current blocking layer 7b, thereby forming a p type InP second upper cladding layer 8 and a p type InGaAsP contact layer 19.

Thereafter, a p side electrode is formed on the p type InGaAsP contact layer 19 and an n side electrode 1a is formed at the side of the n type substrate 1, thereby completing a quantum wire laser of this embodiment.

In the fabricating method of a quantum wire laser of this third embodiment, a semiconductor laser having a buried heterostructure structure employs high density wires fabricated by the method of the first embodiment. Because wires of high density having narrow intervals and wires of a high quality and superior in the optical characteristics not subjected to processing damage are obtained, a semiconductor laser having improved laser characteristics such as low threshold current, high efficiency, and low temperature dependency employing the quantum wire is obtained.

As described above, quantum wires of a high density and high quality essential for the quantum wire laser which has not been obtained by the conventional method can be realized by the first embodiment, and the quantum wire laser employing the high density and high quality wires can be realized by the second and the third embodiments.

Embodiment 4

A description is given of a method of fabricating a diffraction grating by selective growth according to a fourth embodiment of the present invention.

FIG. 6 is a plan view illustrating the upper surface of a mask for forming a diffraction grating by selective growth according to the fourth embodiment of the present invention, and FIGS. 7(a) and 7(b) are is a cross sectional schematic diagrams in a case where a diffraction grating is fabricated employing this mask (a cross section in along 7-7' in FIG. 6).

In the FIG. 6, reference numeral 16 designates a mask for forming a diffraction grating, comprising stripe shaped patterns having strips in the vertical direction in the figure arranged in the transverse direction in the figure. Reference numeral 15 designates a mask for adjusting a height of the diffraction grating formed by the mask 15 so the mask 15 is between the diffraction grating forming mask 16 at upward and downward directions in the figure.

A description is given of a fabricating method of a diffraction grating.

First of all, on a p type InP substrate 21 of an impurity concentration of about $5 \times 10^{18} \text{cm}^{-3}$, a p type InP layer 22 having a thickness of 1 μm and an impurity concentration of about $1 \times 10^{18} \text{cm}^{-3}$, an undoped InGaAsP active layer 23 having a thickness of 0.1 μm and a composition corresponding to a wavelength of 1.3 μm or 1.55 μm, and an n type InP layer 24 having a thickness of 0.1 μm and an impurity concentration of about $1 \times 10^{18} \text{cm}^{-3}$ are grown, and on the surface of the wafer a $SiO_2$ film 26 is formed and the $SiO_2$ film 26 is patterned into a pattern as shown in FIG. 6.

Here, the diffraction grating forming mask 16 is formed with a pitch of about 200 nm. A mask for controlling the thickness of layer 15 is provided over a width of several tens of μm in the resonator length direction so that several patterns in a region of the diffraction grating forming mask 16 are between layer 15. The interval between the patterns of the layer thickness controlling mask 15 by which the diffraction grating forming mask 16 is sandwiched is about 100 μm. On a wafer including such diffraction grating forming mask 16 and layer thickness controlling mask 15, InGaAsP layer 25 having a composition corresponding to a wavelength of 1.15 μm is selectively grown by MOCVD or CBE, whereby InGaAsP diffraction gratings 25a and 25b of trapezoid configuration are formed on a portion of the aperture of the diffraction grating forming mask 16 as shown in FIG. 7(a). Then, at a region sandwiched by the patterns of the layer thickness controlling mask 15, the height of the diffraction grating elements 25a of the trapezoidal configuration is higher by about 50 nm than the height of the diffraction grating elements 25b of trapezoidal configuration at regions other than that, which is about 30 nm. This is because at the region between the patterns of the layer thickness controlling mask 15 the Group III element supplied to the mask 15 moves onto the aperture of the mask 16 at the region sandwiched by the patterns of the layer thickness controlling mask 15 by vapor phase diffusion or surface migration, thereby contributing to the growth of the diffraction grating 25a.

Thereafter, the selective growth masks 15 and 16 are removed, and the entirety of the wafer is buried by the n type InP layer 27 as shown in FIG. 7(b), thereby forming buried type diffraction grating.

In the method of this fourth embodiment, by the same method as the first embodiment, a diffraction grating having different heights of respective diffraction grating portions dependent on regions can be fabricated. Since such diffraction grating can be fabricated with burying the height partially, as described in the following embodiment, it is possible to adjust the light density distribution in the resonator or to form λ/4 shifted diffraction gratings by partially burying the heights of the diffraction gratings along the resonator direction of the laser in making a distributed feedback laser having diffraction grating.

Embodiment 5

A fifth embodiment of the present invention provides a distributed feedback laser that adjusts the light density distribution in the resonator direction employing the method of the fourth embodiment.

Figure 8:
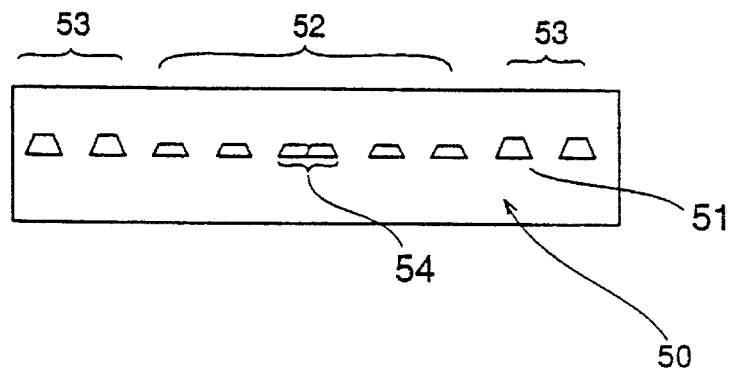
FIG. 8 is a cross sectional schematic diagram illustrating a resonator and diffraction grating of a distributed feedback laser according to a fifth embodiment of the present invention.

FIG. 8 shows a distributed feedback semiconductor laser according to this fifth embodiment. In the figure, reference numeral 51 designates a diffraction grating, reference numeral 50 designates the entirety of the diffraction grating, numeral 52 designates a region of the center portion of the resonator, numeral 53 designates a region at the end of the resonator, and numeral 54 designates a λ/4 shifted region.

Figure 10:
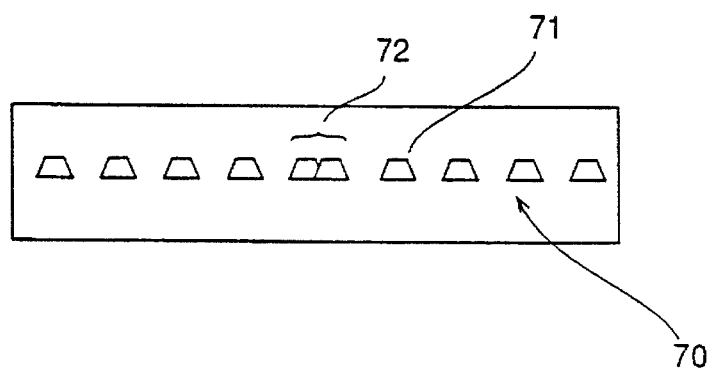
FIG. 10 is a cross sectional schematic diagram illustrating a resonator and diffraction grating of a prior art λ/4 shifted distributed feedback laser.
Figure 11:
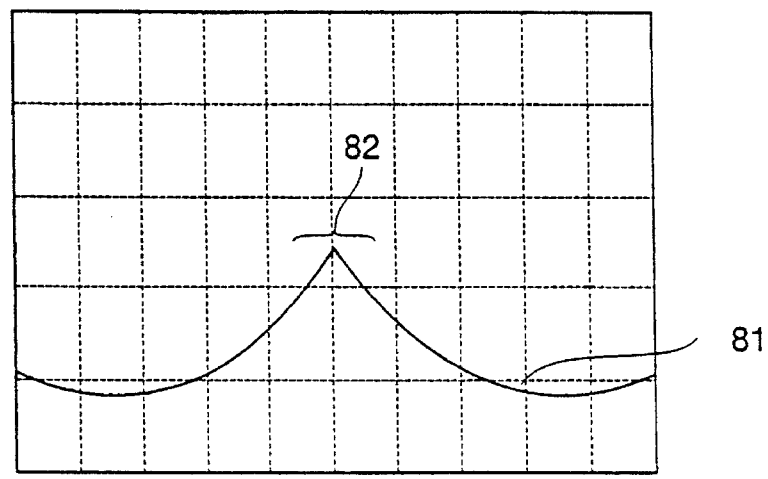
FIG. 11 is a diagram illustrating light density distribution in the resonator of a prior art λ/4 shifted distributed feedback laser.
Figure 12:
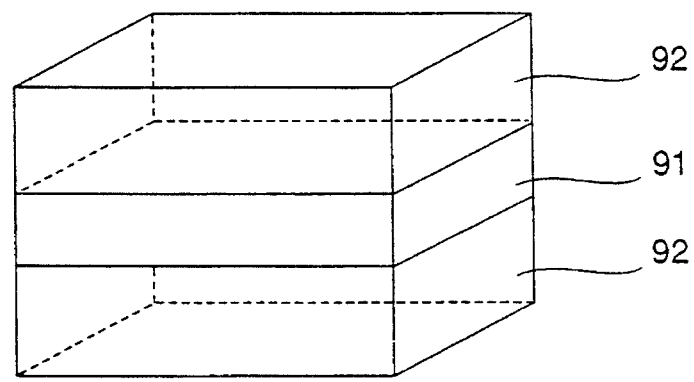
FIG. 12 is a diagram illustrating an active layer in bulk.
Figure 13:
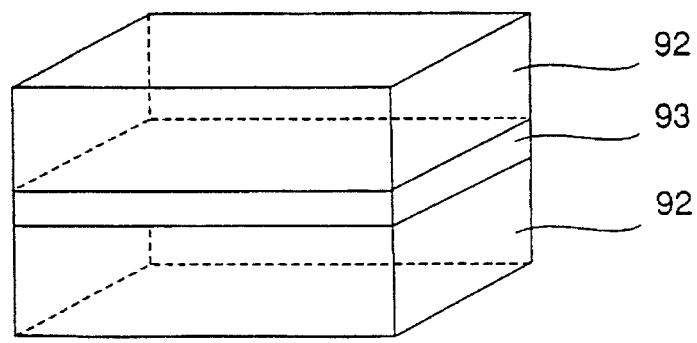
FIG. 13 is a diagram illustrating a quantum thin film active layer.
Figure 14:
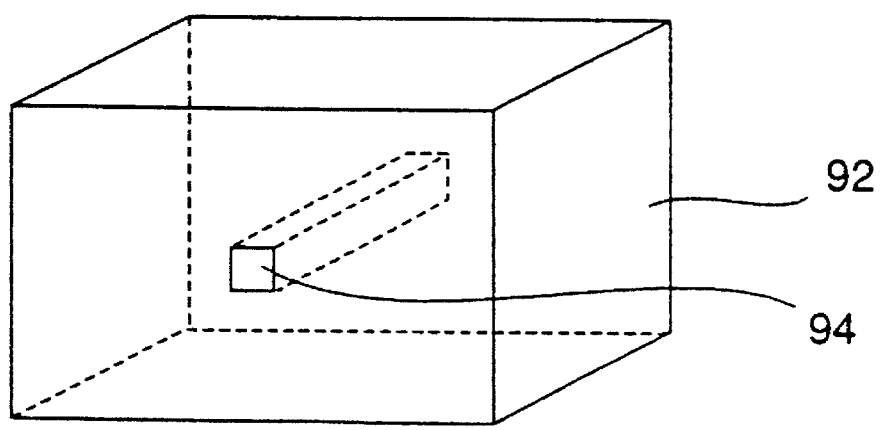
FIG. 14 is a diagram illustrating a quantum wire active layer.
Figure 15:
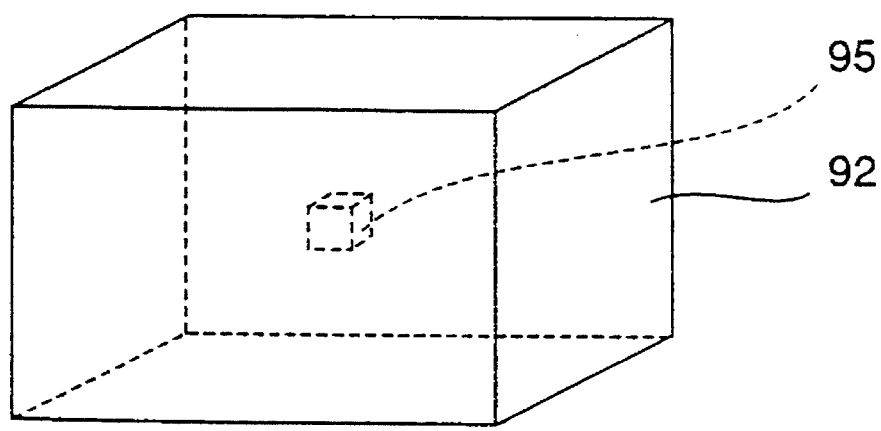
FIG. 15 is a diagram illustrating a quantum box active layer.
Figure 16:
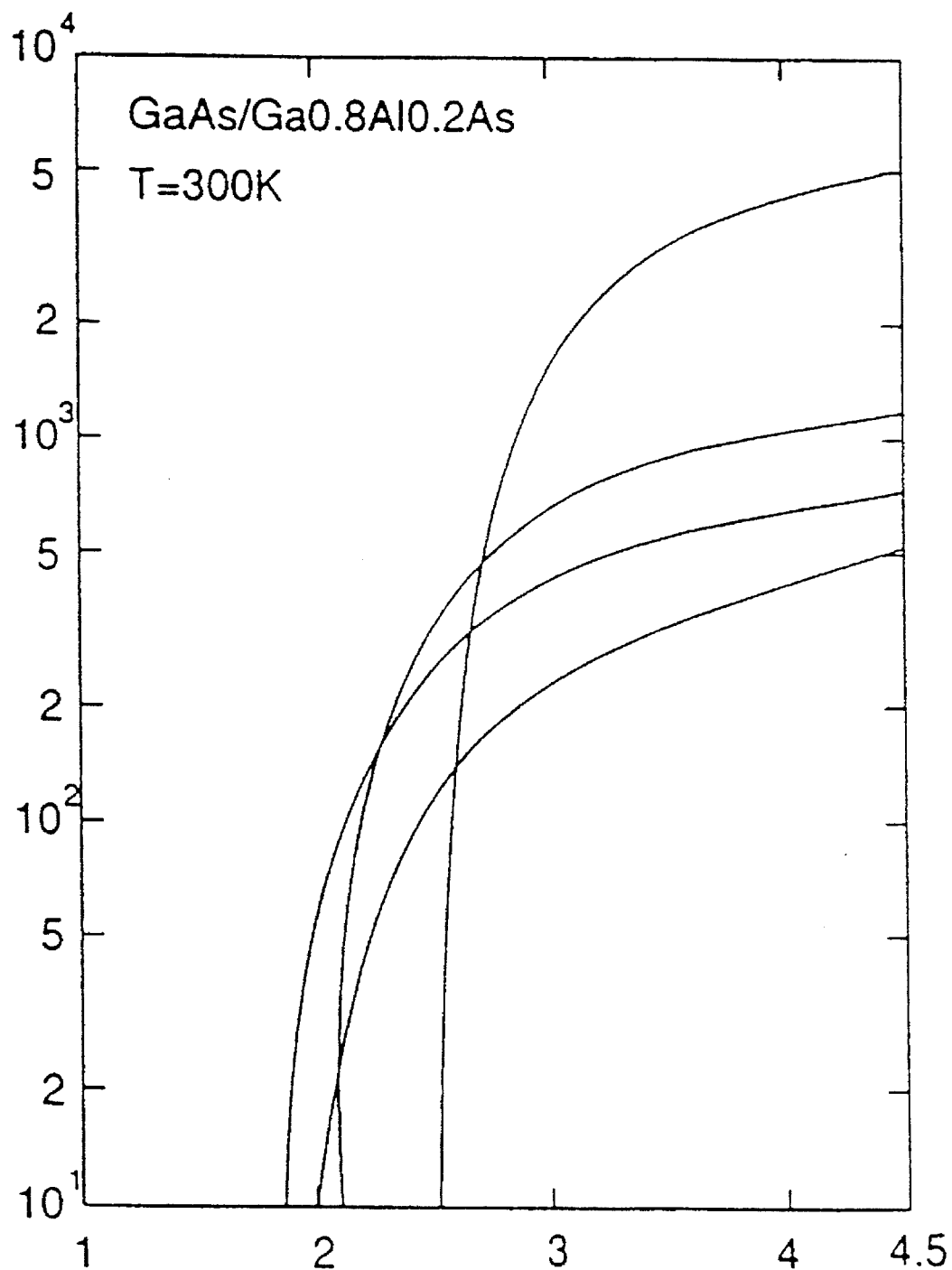
FIG. 16 is a diagram for explaining quantum effects of a quantum thin film structure, a quantum well structure, and a quantum box structure.
Figure 17:
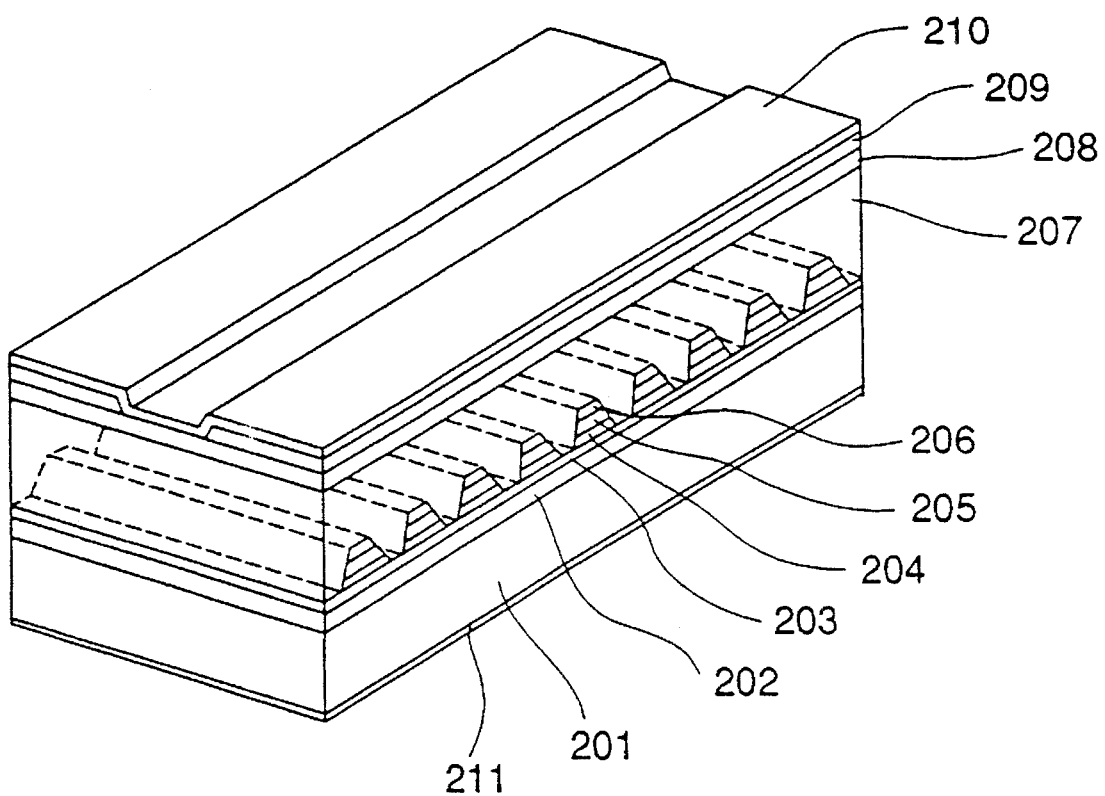
FIG. 17 is a diagram illustrating a structure of a quantum wire laser fabricated by a prior art fabricating method of a quantum wire.
Figure 18A:
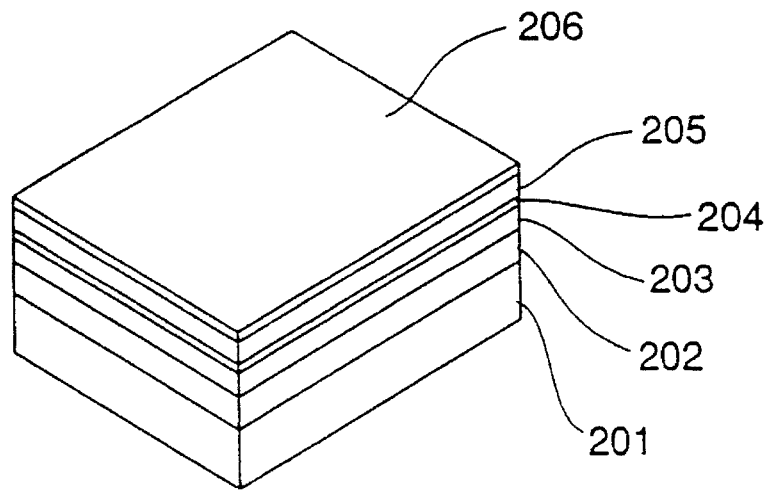
FIGS. 18(a) to 18(c) are diagrams illustrating a fabricating process of a quantum wire laser of FIG. 17.
Figure 18B:
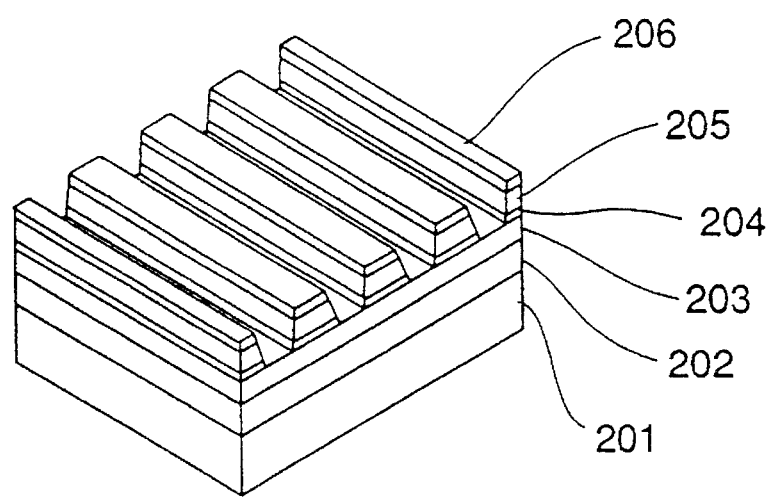
Figure 18C:
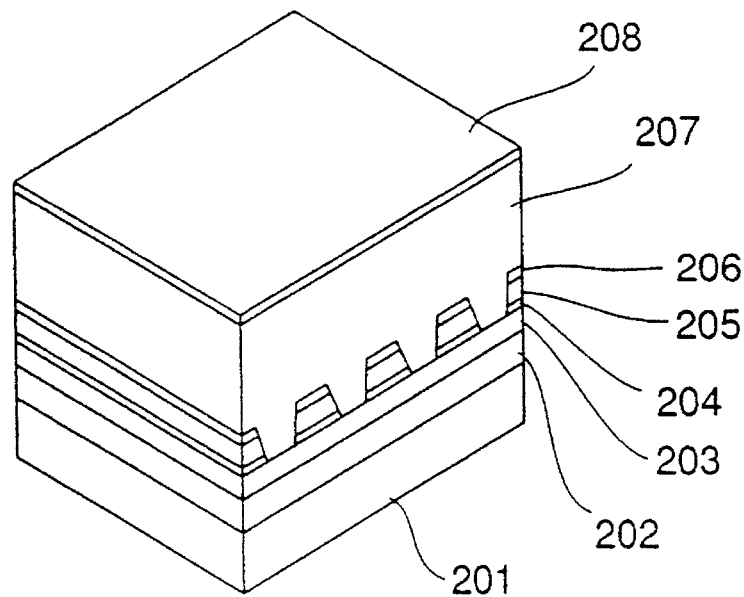
Figure 19:
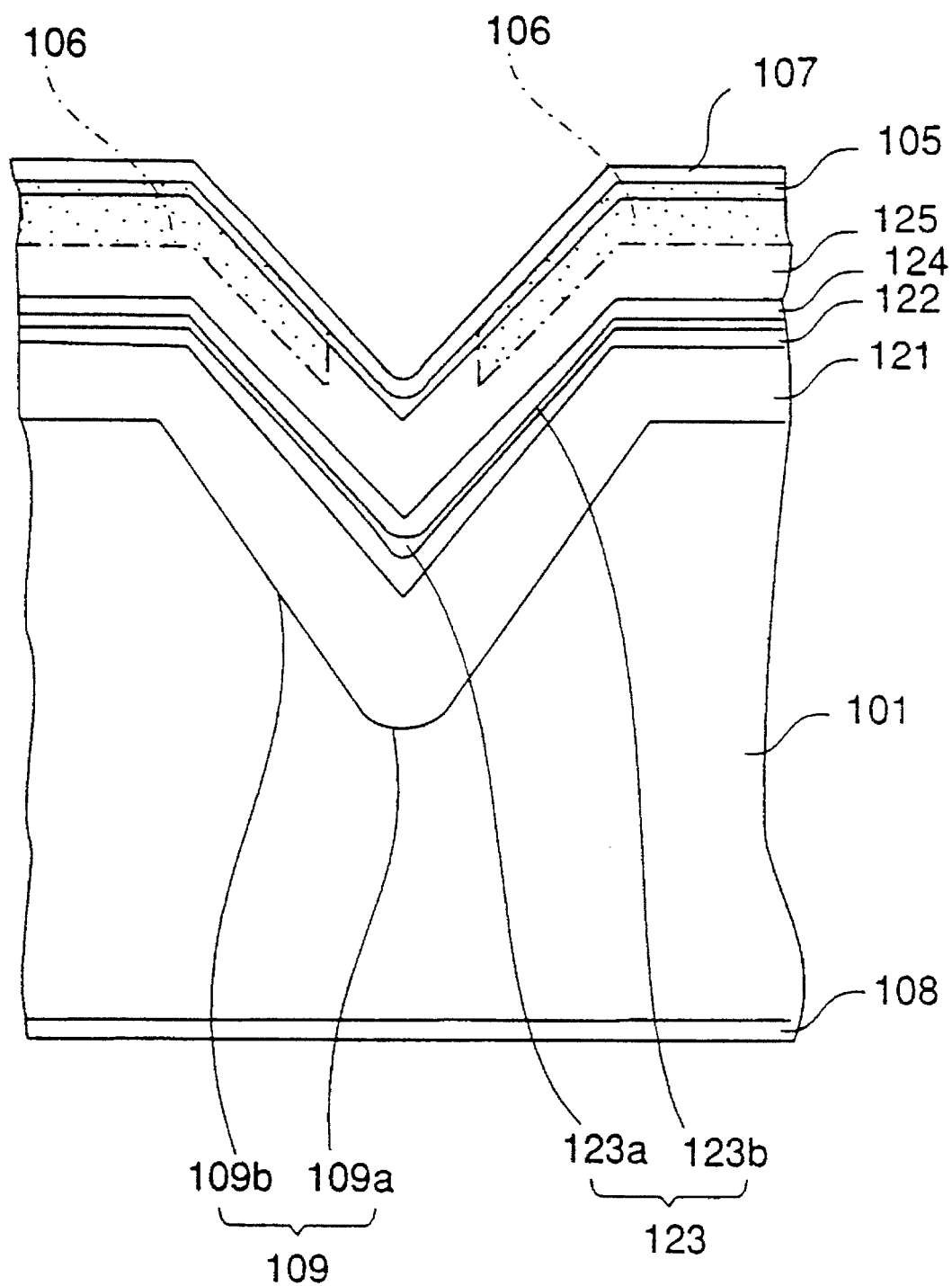
FIG. 19 is a diagram illustrating a structure of a quantum wire laser fabricated employing another prior art fabricating method of a quantum wire.
Figure 20A:
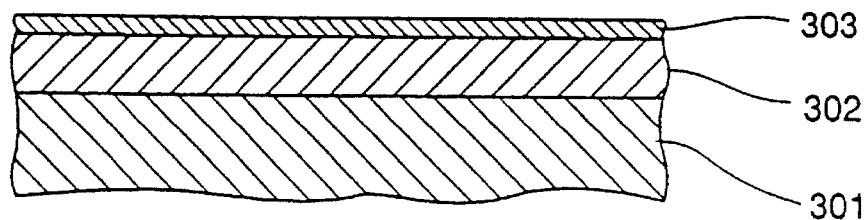
FIGS. 20(a) to 20(c) are diagrams illustrating another prior art fabricating method of a quantum wire.
Figure 20B:
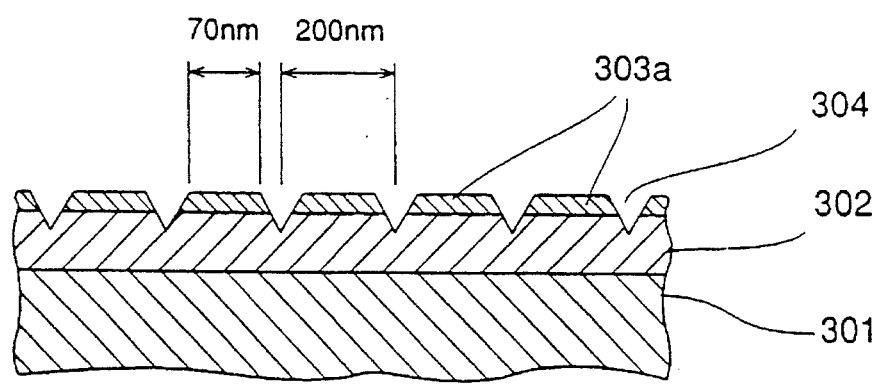
Figure 20C:
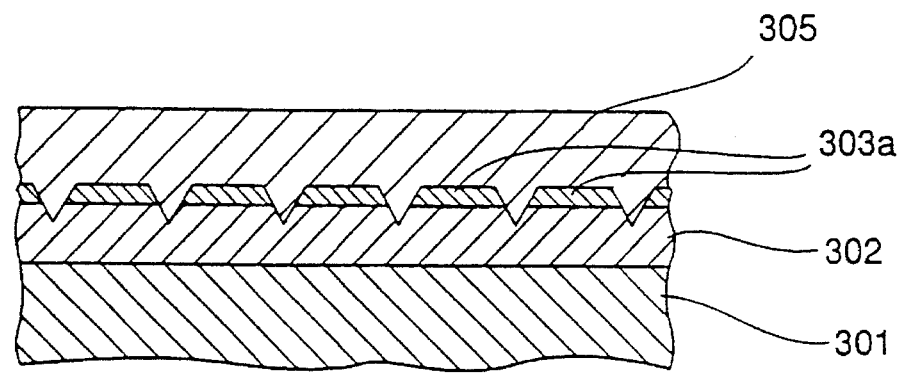
Figure 21A:
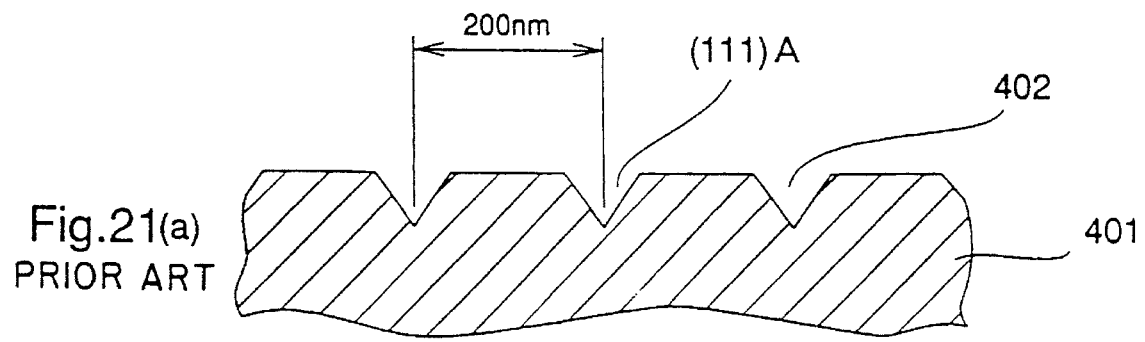
FIGS. 21(a) and 21(b) are diagrams illustrating another prior art fabricating method of a quantum wire.
Figure 21B:
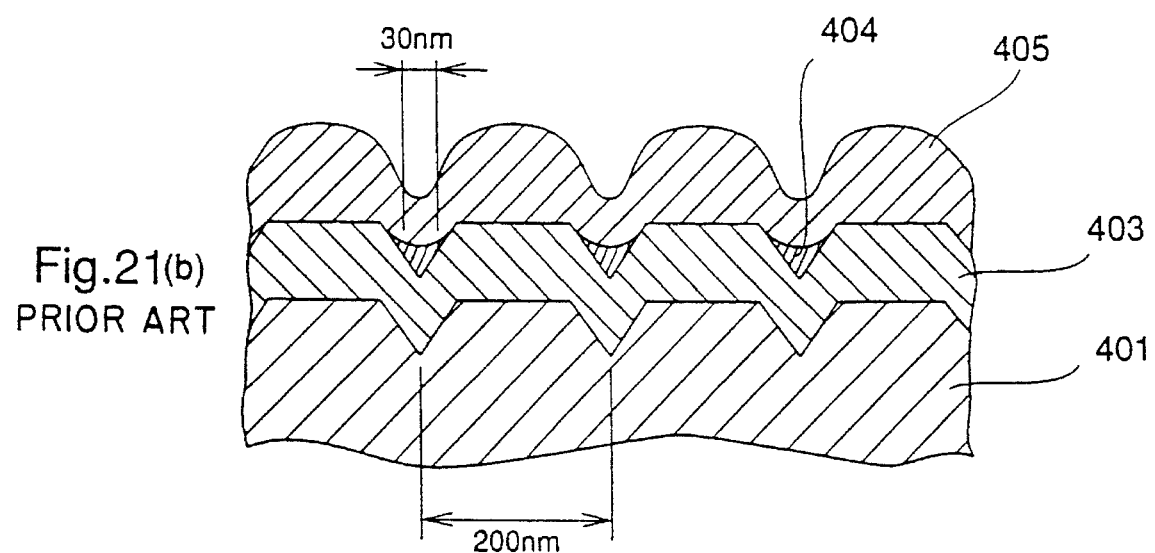
Figure 22A:
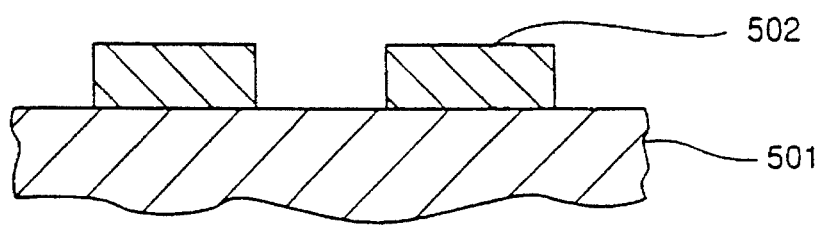
FIGS. 22(a) to 22(d) are diagrams illustrating another prior art fabricating method of a quantum wire.
Figure 22B:
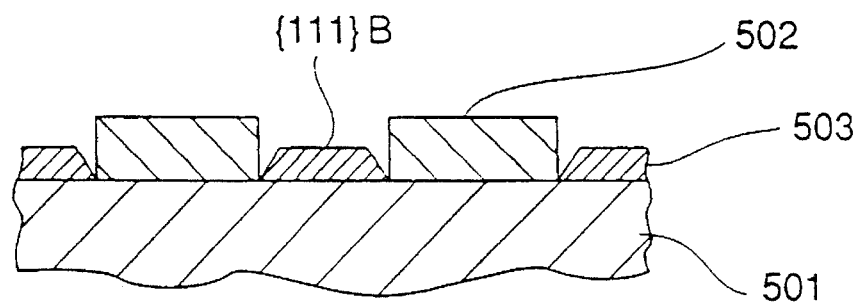
Figure 22C:
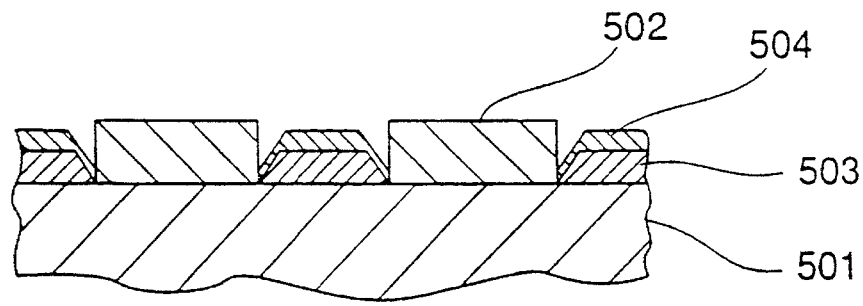
Figure 22D:
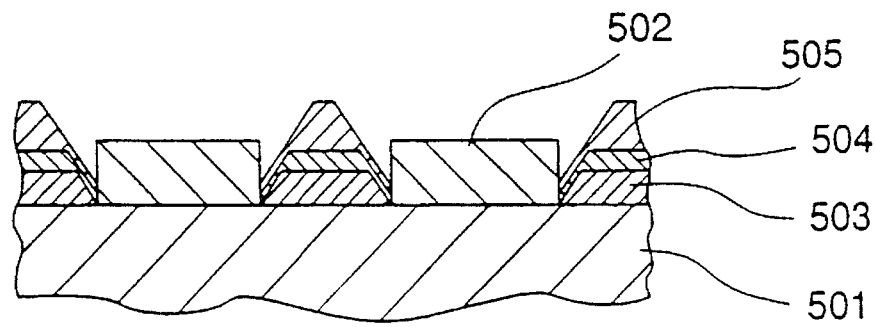
Figure 23A:
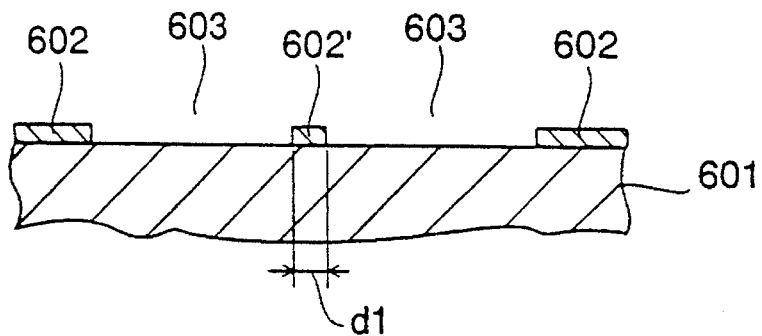
FIGS. 23(a) to 23(e) are diagrams illustrating a still another prior art fabricating method of a quantum wire.
Figure 23B:
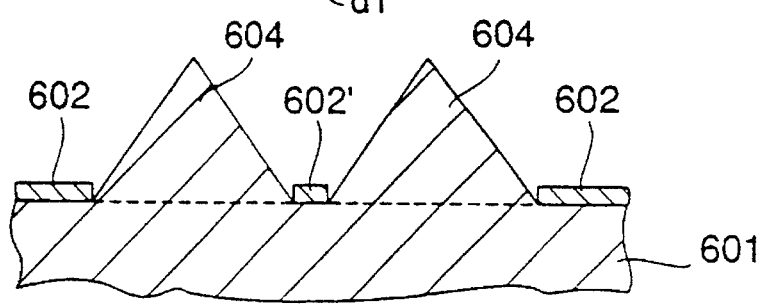
Figure 23C:
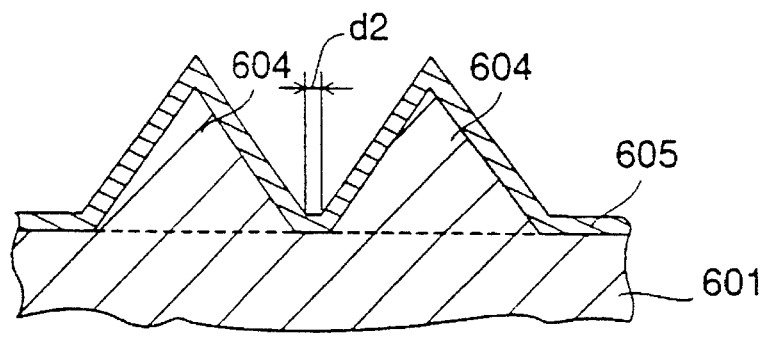
Figure 23D:
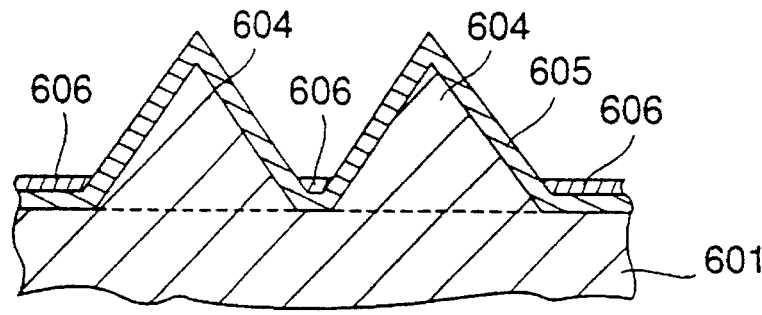
Figure 23E:
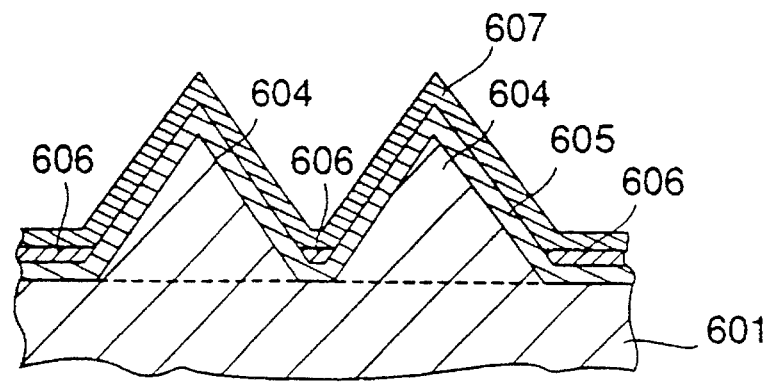
Figure 24A:
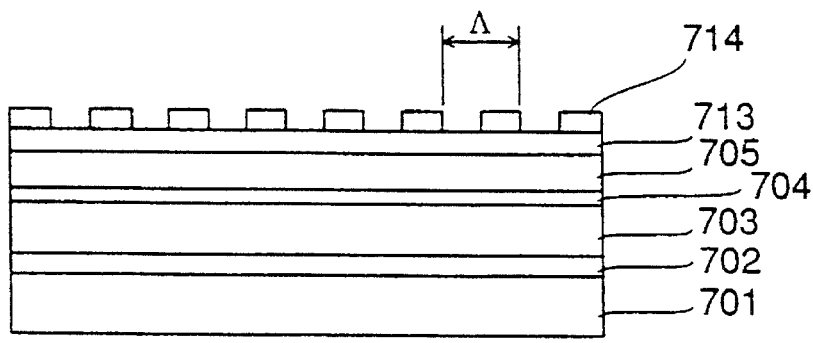
FIGS. 24(a) to 24(d) are diagrams illustrating a prior art fabricating method of a semiconductor laser having a diffraction grating.
Figure 24B:
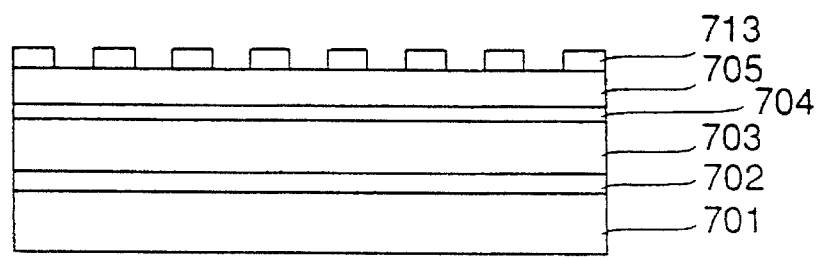
Figure 24C:
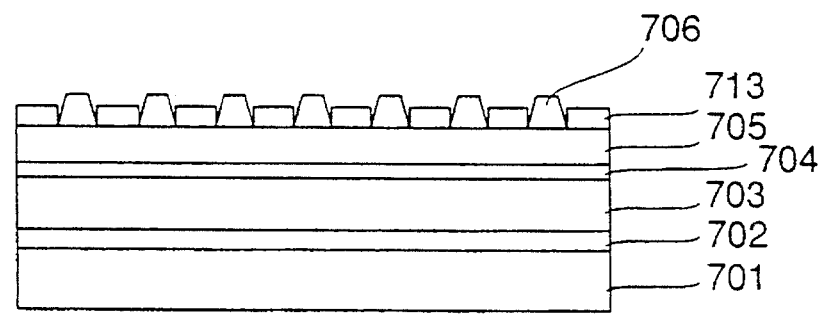
Figure 24D:
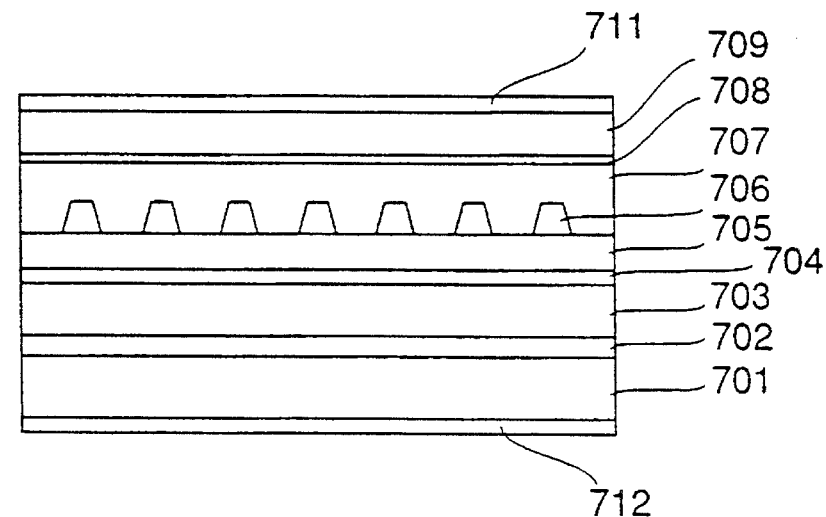

FIG. 10 shows a prior art distributed feedback semiconductor laser. When the diffraction grating (λ/4 shifted diffraction grating) 70 comprising a diffraction grating 71 having a uniform height over the entirety in the resonator direction is provided with a λ/4 phase shift region 72 at the center portion of the resonator, the light density distribution in the resonator direction becomes a non-uniform distribution 81 which has a larger light density at the center portion as shown in FIG. 11. The portion 82 having such a large light density causes hole burning in the distributed feedback laser, thereby deteriorating the LD characteristics, particularly the light output current characteristics.

In such a case, as in the fifth embodiment of the present invention shown in FIG. 8, if the height of the diffraction grating 51 is lowered at the region 52 of the center portion of the resonator and the height of the diffraction grating 51 is increased at the region 53 in the vicinity of the resonator facet, the light density distribution can be made uniform over the entirety of the resonator length.

The reason thereof is as in the following.

Generally, the proportion that the light propagating in the resonator and reflected by the diffraction gratings becomes larger as the coupling constant k between the light and the diffraction grating becomes larger. Further, as the height of the diffraction grating becomes higher, the coupling constant becomes larger. In other words, reflection and feedback of light by the diffraction grating elements 51 is weak in the region 52 at the resonator central portion having a lower height, i.e., amplitude of the diffraction grating elements 51 while the effects of reflection and feedback of light are intensified in the regions 53 in the vicinity of the resonator ends having increased heights, i.e., amplitudes of the diffraction grating elements 51. As a result, relative to a case of the diffraction grating 70 having a uniform height i.e., amplitude as shown in FIG. 10, the light density is small at the region 52 of the central portion of the resonator and the light density is large at the regions 53 in the vicinity of the resonator ends. Accordingly, the non-uniform light density distribution 81 shown in FIG. 11, which is obtained in a case of diffraction grating 70 having uniform height, can be averaged and made uniform.

In the distributed feedback semiconductor laser of this fifth embodiment, by fabricating a diffraction grating employing a fabricating method according to the fourth embodiment and lowering the height of the diffraction grating elements 51 at the region 52 at the center portion of the resonator and increasing the height of the diffraction grating elements 51 at the regions 53 in the vicinity of the resonator ends, the light density distribution can be made uniform over the entirety of the resonator length, whereby a distributed feedback semiconductor laser that has no deterioration in the LD characteristics, especially in the light output current characteristics, due to hole burning is obtained.

Embodiment 6

The method of partially varying the height of the diffraction grating as in the fourth embodiment can be also applied to a fabrication of a λ/4 shifted diffraction grating itself. This sixth embodiment is a distributed feedback type semiconductor laser having a λ/4 shifted diffraction grating.

The λ/4 shifted diffraction grating forms a region shifting a pitch of the diffraction grating at the central portion of the element by ¼ wavelength in order to improve the single wavelength property of a distributed feedback laser.

A λ/4 shifted diffraction grating is usually fabricated by patterning by interference exposure or electron beam direct drawing. However, in the interference exposure method a, photolithography process has to be performed twice to perform λ/4 shifting and the process is extremely complicated, while in the EB direct drawing, respective patterns have to be drawn successively, whereby the fabrication takes a long time, thereby reducing the throughput.

On the contrary, the sixth embodiment of the present invention applies the method described in the third embodiment to fabrication of a λ/4 shifted diffraction grating in which the refractive index of the waveguide region is changed partially to shift the phase equivalently to a λ/4 shifted diffraction grating. A description is given of a fabricating method of a diffraction grating according to this sixth embodiment.

Figure 9:
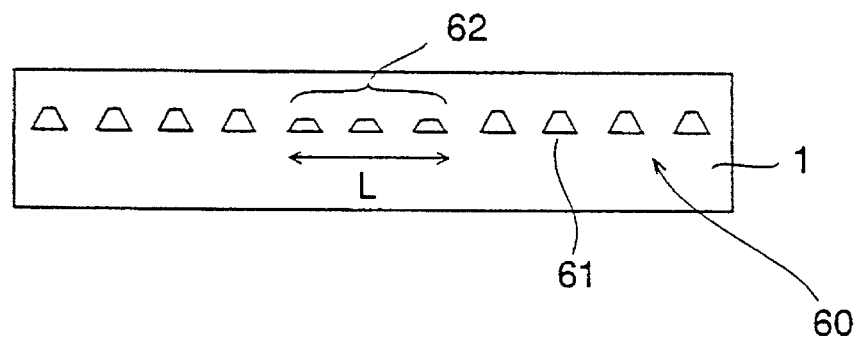
FIG. 9 is a cross sectional schematic diagram illustrating a resonator and diffraction grating having a λ/4 shifted distributed feedback laser according to a sixth embodiment of the present invention.

In FIG. 9, reference numeral 61 designates a diffraction grating. Reference numeral 60 designates entirety of the diffraction grating. Reference numeral 62 designates a λ/4 shifted region of length L at the central portion of the resonator in which the refractive index of the waveguide region is partially changed to equivalently shift the phase.

As shown in FIG. 9, when the height of the InGaAsP diffraction grating 61 is made low (or high) at the λ/4 shift region 62 at the central portion of the element, the distribution in the layer thickness direction of the propagating light and the equivalent refractive index n which is determined by the refractive index and the layer thickness of respective InP layer 1 and InGaAsP layer 61 cause changes.

When the length of the region having a changing equivalent refractive index n is taken as L and the change of the equivalent refractive index n is taken as Δn, if the height and the length L of the diffraction grating are designed to satisfy the condition of;

$\Delta n \cdot L = \lambda/4$ (λ is wavelength of light), a λ/4 shift is realized. As an example, when λ=1.55 μm, Δ=0.00775, L=50 μm are preferable.

In this method, the pitch of the entire diffraction grating 60 may be constant (the interval between the diffraction grating is about 200 μm), and complicated processes for shifting pitches such as two photolithography processes or pattern drawing for respective patterns are not required, whereby a λ/4 shifted diffraction grating can be fabricated simply.

In the distributed feedback semiconductor laser having a λ/4 shifted diffraction grating according to a sixth embodiment of the present invention, the method of partially varying the height of diffraction grating elements is applied in fabrication of the λ/4 shifted diffraction grating itself as in the fourth embodiment. Therefore, the λ/4 shifted diffraction grating shifting the pitch of the diffraction grating by a ¼ wavelength at a central portion of the element so as to improve the single wavelength property of a distributed feedback laser can be fabricated simply without the problems of quite complicated processes such as requiring two photolithography processes employing interference exposure or successively drawing respective patterns by EB direct drawing. In this way, the λ/4 shifted diffraction grating can be simply fabricated and a λ/4 shifted distributed feedback laser improved single wavelength property can be easily obtained.

What is claimed is:

1. A method of fabricating a quantum wire structure comprising:

forming an insulating film on a surface of a substrate of a first semiconductor, the insulating film including a pattern of spaced apart mask elements having a width not exceeding 100 nm;

selectively growing a layer of a second semiconductor on the surface of the substrate employing the insulating film as a growth mask, the layer comprising spaced apart second semiconductor elements, each second semiconductor element having a trapezoidal cross-section transverse to the surface of the substrate and including an upper surface generally parallel to the surface of the substrate and sloped surfaces oriented so that a third semiconductor does not grow on the sloped surfaces;

removing the insulating film, thereby exposing the surface of the substrate between the spaced apart second semiconductor elements;

growing a layer of a third semiconductor having a smaller band gap energy than the band gap energies of the first and second semiconductors simultaneously on the upper surfaces of the second semiconductor elements and on the surface of the substrate between adjacent second semiconductor elements but not on the sloped surfaces of the second semiconductor elements, whereby a plurality of quantum wires of the third semiconductor periodically and alternatingly arranged on the surface of the substrate and on the upper surfaces of the second semiconductor elements are produced; and growing a layer of a fourth semiconductor having a band gap energy larger than the band gap energy of the third semiconductor on and burying the quantum wires and the layers of the second and third semiconductors.

2. The method of claim 1 wherein the first semiconductor is InP, the second semiconductor is InP, the third semiconductor is InGaAs, and the fourth semiconductor is InP.

3. The method of claim 2 wherein the sloped surfaces are one of (111)A and (111)B surfaces.

4. The method of claim 3 comprising, after removing the insulating film and before forming the layer of the third semiconductor layer, growing an InP layer on the sloped surfaces and upper surfaces of the second semiconductor elements and on the surface of the substrate between adjacent second semiconductor elements.

* * * * *